US012492512B2

(12) United States Patent
Pal et al.

(10) Patent No.: US 12,492,512 B2
(45) Date of Patent: Dec. 9, 2025

(54) FUNCTIONAL PAPER FOR ELECTRONICS PRINTING AND METHODS OF MAKING

(71) Applicants: North Carolina State University, Raleigh, NC (US); Domtar Paper Company LLC, Fort Mill, SC (US)

(72) Inventors: Lokendra Pal, Raleigh, NC (US); Manoj Kumar Dixit, Matthews, NC (US); Sachin Agate, Raleigh, NC (US); Brian Watson Ranson, Greensboro, SC (US)

(73) Assignees: North Carolina State University, Raleigh, NC (US); Domtar Paper Company LLC, Fort Mill, SC (US)

( * ) Notice: Subject to any disclaimer, the term of this patent is extended or adjusted under 35 U.S.C. 154(b) by 340 days.

(21) Appl. No.: 17/979,087

(22) Filed: Nov. 2, 2022

(65) Prior Publication Data

US 2023/0136850 A1     May 4, 2023

Related U.S. Application Data

(60) Provisional application No. 63/275,092, filed on Nov. 3, 2021.

(51) Int. Cl.
*D21H 21/16* (2006.01)
*D21H 17/29* (2006.01)
(Continued)

(52) U.S. Cl.
CPC ............ *D21H 21/16* (2013.01); *D21H 17/29* (2013.01); *D21H 17/37* (2013.01); *D21H 17/66* (2013.01); *D21H 23/24* (2013.01);
*H05K 1/0386* (2013.01); *H05K 1/097* (2013.01); *H05K 2201/10037* (2013.01); *H05K 2201/10098* (2013.01);
(Continued)

(58) Field of Classification Search
CPC ............... H05K 1/0386; H05K 1/097; H05K 2201/10037; H05K 2201/10098; H05K 2201/10106; H05K 2201/10128; H05K 2201/10151; D21H 21/16; D21H 17/29;
(Continued)

(56) References Cited

U.S. PATENT DOCUMENTS

2008/0035292 A1* 2/2008 Singh .................. D21H 17/34
162/175
2010/0220074 A1* 9/2010 Irvin, Jr. ............... G06F 3/045
345/174
(Continued)

OTHER PUBLICATIONS

Smook Front Matter (Year: 2016).*
Gary A Smook, Handbook for Pulp & Paper Technologists, 2016, published by Tappi, p. 293-309 (Year: 2016).*

*Primary Examiner* — Jacob T Minskey
*Assistant Examiner* — Elisa H Vera
(74) *Attorney, Agent, or Firm* — THOMAS | HORSTEMEYER, LLP

(57) ABSTRACT

Provided herein is an uncoated functional paper formed from a slurry comprising about 10 wt % to 90 wt % cellulosic fibers and about 1% to 25% sizing solution per total weight of the fibers. The sizing solution can be applied during papermaking and/or applied in a size press or coater. The paper can be calendered at a temperature greater than 50° C. Methods of making are also provided. Also provided are flexible electronics including a functional paper substrate printed with a conductive ink.

6 Claims, 20 Drawing Sheets

(51) Int. Cl.
  *D21H 17/37* (2006.01)
  *D21H 17/66* (2006.01)
  *D21H 23/24* (2006.01)
  *H05K 1/03* (2006.01)
  *H05K 1/09* (2006.01)
(52) U.S. Cl.
  CPC .............. *H05K 2201/10106* (2013.01); *H05K 2201/10128* (2013.01); *H05K 2201/10151* (2013.01)
(58) Field of Classification Search
  CPC ........ D21H 17/37; D21H 17/66; D21H 23/24; D21H 17/28
  See application file for complete search history.

(56) References Cited

U.S. PATENT DOCUMENTS

2017/0145636 A1* 5/2017 Zhou ...................... D21H 17/67
2020/0305278 A1* 9/2020 Curtil ........................ D21J 3/12

* cited by examiner

FUNCTIONAL PAPER FOR ELECTRONICS PRINTING AND METHODS OF MAKING

CROSS-REFERENCE TO RELATED APPLICATIONS

This application claims the benefit of and priority to U.S. Provisional Application Ser. No. 63/275,092, having the title "FUNCTIONAL PAPER FOR ELECTRONICS PRINTING AND METHODS OF MAKING", filed on Nov. 3, 2021, the disclosure of which is incorporated herein by reference in its entirety.

BACKGROUND

For printed/flexible hybrid electronics, substrates have been developed, including plastic films such as PET, microporous coated/PE extruded papers, or multilayer coated papers with high smoothness values similar to that of films. Mostly, these substrates provide high ink holdout but have poor durability and ink adhesion that required additional processing steps. Further, these substrates are costly to produce and may contain materials from petrochemical sources that don't biodegrade quickly. Furthermore, microporous coated/PE extruded papers, or multilayer coated papers tend to be thick and less flexible. Demand for paper-based sustainable materials continues to grow due to environmentally conscious consumers and retailers, government legislations, and supply chain transformation. These needs and other needs are satisfied by the present disclosure.

SUMMARY

Embodiments of the present disclosure provide for functional papers, methods of making functional papers, products including functional papers, and the like.

An embodiment of the present disclosure includes a functional paper, wherein the functional paper is an uncoated paper. The paper can be formed from a slurry comprising about 10 wt % to 90 wt % cellulosic fibers and about 1% to 25% sizing solution per total weight of the fibers. The sizing solution can be applied during papermaking, applied in a size press or coater after the paper has been made, or both. The paper can be subjected to a calendering treatment at a temperature greater than 50° C.

An embodiment of the present disclosure also includes a method of making a functional paper. The forming a paper can be formed from a slurry, the slurry comprising about 10 wt % to 90 wt % cellulosic fibers and about 1% to 25% sizing solution per total weight of the fibers. The paper can then be calendered at a temperature greater than 50° C.

An embodiment of the present disclosure also includes a flexible electronic that includes a functional paper substrate printed with a conductive ink. The functional paper substrate can be formed from a slurry comprising about 10 wt % to 90 wt % cellulosic fibers and about 1% to 25% sizing solution per total weight of the fibers. The flexible electronic can have an electrical resistance of about 7.0 Ω/cm to 0.5 Ω/cm.

Other compositions, apparatus, methods, features, and advantages will be or become apparent to one with skill in the art upon examination of the following drawings and detailed description. It is intended that all such additional compositions, apparatus, methods, features and advantages be included within this description, be within the scope of the present disclosure, and be protected by the accompanying claims.

BRIEF DESCRIPTION OF THE DRAWINGS

Further aspects of the present disclosure will be more readily appreciated upon review of the detailed description of its various embodiments, described below, when taken in conjunction with the accompanying drawings.

FIG. 2A, Caliper; FIG. 2B, Roughness (Parker Print Surf); FIG. 2C, Porosity (Gurley seconds for 100 ml of air).

FIG. 4B, Example 2; FIG. 4C, Example 3; FIG. 4D, Example 4)

FIG. 9B, Example 9s; FIG. 9C, Example 9sm; FIG. 9D, Example 9sd; FIG. 9E, Example 9st; FIG. 9F, Example 9ss)

FIG. 14B, Example 10s; FIG. 14C, Example 10sm; FIG. 14D, Example 10sd; FIG. 14E, Example 10st; FIG. 14F, Example 10ss)

(FIG. 18B) Example 8: Surface mark on the ink, but the ink layer remains intact; (FIG. 18C) Example 6: Surface mark with partial removal of the silver ink; (FIG. 18D) Example 7: Surface mark with partial removal of the silver ink; (FIG. 18E) Example 5: Surface mark with partial removal of the silver ink.

Figure 1:
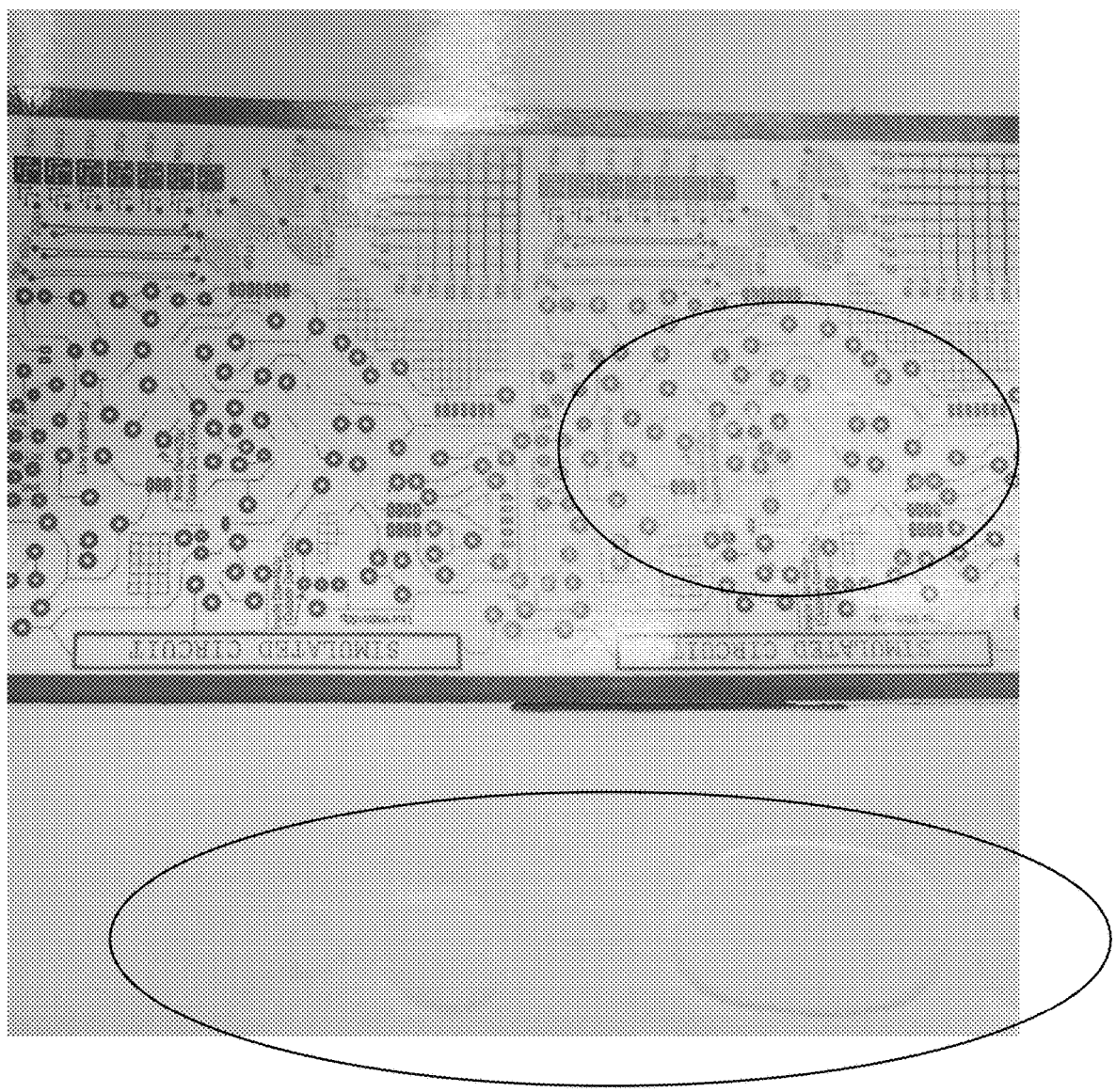
FIG. 1 is a camera image showing an example of blisters after drying for multilayer plastic-coated paper (circled).

The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. In the drawings, similar reference numerals between figures designate like or corresponding, but not necessarily the same, elements.

DETAILED DESCRIPTION

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, material science, and the like, which are within the skill of the art.

The following examples are put forth so as to provide those of ordinary skill in the art with a complete disclosure and description of how to perform the methods and use the papers disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise.

As used herein, the following terms have the meanings ascribed to them unless specified otherwise. In this disclosure, "consisting essentially of" or "consists essentially" or the like, when applied to methods and compositions encompassed by the present disclosure refers to compositions like those disclosed herein, but which may contain additional structural groups, composition components or method steps (or analogs or derivatives thereof as discussed above). Such additional structural groups, composition components or method steps, etc., however, do not materially affect the basic and novel characteristic(s) of the compositions or methods, compared to those of the corresponding compositions or methods disclosed herein. "Consisting essentially of" or "consists essentially" or the like, when applied to methods and compositions encompassed by the present disclosure have the meaning ascribed in U.S. Patent law and the term is open-ended, allowing for the presence of more than that which is recited so long as basic or novel characteristics of that which is recited is not changed by the presence of more than that which is recited, but excludes prior art embodiments.

General Discussion

In accordance with the purpose(s) of the present disclosure, as embodied and broadly described herein, embodiments of the present disclosure, in some aspects, relate to functional papers.

In general, embodiments of the present disclosure provide for methods of making functional papers and products including functional paper.

The present disclosure includes functional paper. Advantageously, the functional papers described herein can be used as a substrate for flexible hybrid electronics such as simple circuits, disposable sensors, light emitting diode (LED) or solar cells. The functional papers can exhibit a conductivity range similar to that of traditional films and microporous coated paper while delivering a significant improvement in durability.

In some embodiments, the functional papers provided herein are uncoated. Uncoated, as used herein, refers to a paper that is not traditionally coated or pigment coated (e.g. polycoated, PET, clay, carbonate, silica). Instead, the functional paper is only surface treated with surface sizing. Advantageously, the functional paper has comparable performance to coated papers, but is more flexible, thinner, and cost-effective to produce. Additionally, the functional paper does not delaminate under high heat, which can occur with coated papers such as PET-coated papers during curing of functional inks. Where the terms "coated", "coat", or "coating" are used in reference to the functional papers and functional electronics described herein, the terms refer to the surface treatment but should not be confused with traditional coatings or pigment coatings.

In accordance with some embodiments of the presently disclosed functional paper, provided is a composition comprising a cellulosic material, a sizing solution, and mechanical treatment. In various embodiments, the functional paper can include cellulosic fibers in an amount ranging from about 10 wt % to 98 wt %, about 40 wt % to 96 wt %, or about 80 wt % to 94 wt % of a total wt % of the functional paper. The functional paper can include a sizing solution present in an amount ranging from about 0.5 wt % to 25 wt %, about 0.5 wt % to 15 wt %, or about 0.5 wt % to 10 wt % of total fibers.

In various embodiments, the functional paper can include sizing solution in an amount ranging from about 0.1% wt % to 50 wt %, about 1 wt % to 40 wt %, about 2.5 wt % to 25 wt %, or about 3.5 wt % to 10 wt % of a total wt % of the fibers. The sizing solution may contain film-forming materials, internal sizing agents, brightening agents, fillers, crosslinkers, plasticizers, metal salts, dyes, strength aids, defoamers, surfactants and combinations thereof. The sizing solution can be added to the fiber slurry, sprayed on the paper web, or applied using a size press, coater, calendering unit, or a combination thereof. The sizing solution can be added to the fibers. The functional paper can be dried using conventional techniques such as gravity drainage, vacuum drainage, pressing, conductive steam heated cylinders, hot air convective drying, infrared drying, photonic drying, and combinations thereof.

In various embodiments, the sizing solution components such as internal sizing agents and film-forming materials can be applied separately or together at the wet-end, dry-end or both places of the paper machine.

Sizing solution, as used herein, can refer to internal sizing or surface sizing solutions. Internal sizing solution is added to a paper slurry during the papermaking process. Surface sizing solution is applied to a surface of a partially dried paper web during the papermaking process.

Sizing agents, as used herein, can be added to—or used with—a sizing solution and can include rosins and rosin derivatives, alkyl ketene dimer (AKD), alkenyl ketene dimer (AnKD), Akenylsuccinic anhydride (ASA), polymeric surface sizing agents (e.g. anionic, amphoteric or cationic polymer-based acrylic copolymers, styrene-acrylic dispersions, or styrene-maleic anhydride), and combinations thereof. In general, ASA is used in the wet end, and AKD and AnKD are used in the dry end of the papermaking machine. Although a sizing agent may be referred to as an internal sizing agent or a surface sizing agent, the sizing agents described herein can be used as internal sizing agents, surface sizing agents, or both, as can be envisioned by one of ordinary skill in the art.

Surface sizing agents, as used herein, are applied to a surface of a partially dried paper web during the papermaking process. Surface sizing agents can be applied as a component of a sizing solution or can be applied independently of a sizing solution.

Internal sizing agents, as used herein, are added to a paper slurry during the papermaking process. Internal sizing agents can be applied as a component of a sizing solution or can be applied independently of a sizing solution.

In various embodiments, the functional paper can have been subjected to one or more mechanical treatments. The mechanical treatments can include calendering, embossing, hot pressing, and combinations thereof. The calendering can apply pressure about 100 to 1500 psi, about 200 to 1000 psi, or about 500 to 800 psi. The calendering can be done using a temperature range of about room temperature to 200° C., about to 25° C., to 200° C., about to 50° C. to 150° C., or about to 75° C. to 120° C., depending on the speed. The calendering can be done by single, double or multiple passes through the roller nips.

In some embodiments, the functional paper can be about 96% cellulosic fibers. In some embodiments, the cellulosic fibers are derived from wood. In some embodiments, the wood can include softwood and hardwood. In some embodiments, the functional paper includes softwood and hardwood in a ratio ranging from about 10:90 to 90:10, about 20:80 to 80:20, or about 25:75 to 75:25.

In various embodiments, the cellulosic fibers can be from wood, plant, or recovered paper, or a mixture of plant and wood fibers with two opposed surfaces. In a non-limiting example, suitable fibers include aspen, oak, birch, pine, or mixed hardwood fibers. The hardwood fibers may be prepared by the chemical, mechanical, or hybrid pulping process, as can be envisioned by one of ordinary skill in the art.

In some embodiments, softwood and hardwood is refined separately. The softwood can be refined in a continuous refining process utilizing about 50 to 175 kWH/ton, 75 to 125 kWH/ton or 75 to 150 kWH/ton or about 90 to 110 kWH/ton of refining energy. The hardwood can be refined in continuous refining process utilizing 50 to 250 kWH/ton, 50 to 200 kWH/ton, or about 70 to 200 kWH/ton of refining energy. In some embodiments, a portion of hardwood is highly refined in a continuous refining process utilizing about 100 to 350 kWH/ton, 150 to 300 kWH/ton, 175 to 225 kWH/ton of energy. Other refining processes can be used as envisioned by one of ordinary skill in the art. In some embodiments, the highly refined hardwood cellulose fibers can range from about 1 wt % to 25 wt %, about 2 wt % to 15 wt %, or about 5 wt % to 15 wt % of total fibers in the functional paper.

As mentioned above, the functional paper can include sizing solution. The sizing solution may contain film-forming materials, internal sizing agents, brightening agents, fillers, crosslinkers, plasticizers, metal salts, dyes, strength aids, defoamers, surfactants, or combinations thereof. In some embodiments, the sizing solution includes film-forming polymeric materials. The film-forming polymeric materials may include starches, modified starches, enzymatic modified starches, ethylated starches, cationic starches, alginates, carboxymethyl cellulose, SBR latex, and polyvinyl alcohol or combinations thereof. The film-forming polymeric materials can be in an amount ranging from about 0.1 wt % to 40 wt %, about 2.0 wt % to 25 wt %, or about 3.0 wt % to 15 wt % of a total wt % of the fibers. The film-forming polymeric materials can be added into the fiber slurry, sprayed, or applied using a size press or coating machine, or combinations thereof.

In some embodiments, the sizing solution contains internal sizing agents such as rosins and rosin derivatives, alkyl ketene dimer (AKD), alkenylsuccinic anhydride (ASA), or combinations thereof. The sizing agents can be in an amount ranging from about 0.1 wt % to 10 wt %, about 0.25 wt % to 5 wt %, or about 0.5 wt % to 4 wt % of a total wt % of the functional paper. The sizing agents can be added into the fiber slurry, sprayed or applied using a size press or coating machine or combination thereof.

In some embodiments, the sizing solution contains mono-, di- or multivalent salts, or combinations thereof. The salts can be selected from such as monovalent salts such as sodium chloride (NaCl), divalent salts such as calcium chloride ($CaCl_2$), trivalent salts such as aluminum chloride ($AlCl_3$). The salts can be in an amount ranging from about 0.1 wt % to 10 wt %, about 0.25 wt % to 5 wt %, or about 0.5 wt % to 3 wt % of a total wt % of the functional paper. The salts can be added into the fiber slurry, sprayed or applied using a size press or coating machine or combination thereof. The salts can be mixed with film polymeric materials before application in the fiber slurry, sprayed or size press or coating machine or combination thereof.

In some embodiments, the sizing solution contains crosslinkers such amino resins, anhydrides, dialdehydes, acetals, polycarboxylic acids, phosphorus derivatives, inorganic salts such as ammonium zirconium carbonate (AZC), potassium zirconium carbonate (KZC) and combination thereof. The crosslinkers can be in an amount ranging from about 0.1 wt % to 5 wt %, about 0.25 wt % to 4 wt %, or about 0.5 wt % to 3 wt % of a total wt % of the functional paper. The crosslinks can be added into the fiber slurry, sprayed or applied using a size press or coating machine or combination thereof. The crosslinks can be mixed with film polymeric materials before application in the fiber slurry, sprayer, size press, coating machine, etc.

In some embodiments, the sizing solution contains fillers such clays, carbonates, and combination thereof. The fillers can be in an amount ranging from about 0.1 wt % to 25 wt %, about 0.25 wt % to 20 wt %, or about 0.5 wt % to 5 wt % of a total wt % of the functional paper. The fillers can be added into the fiber slurry, sprayed or applied using a size press or coating machine or combination thereof. The fillers can be mixed with film polymeric materials before application in the fiber slurry, sprayed or size press or coating machine or combination thereof.

In various embodiments, the calendering treatment can be a pressure of less than about 1000 psi, or about 100 to 1000 psi, or about 500 psi, or about 250 psi at an ambient (room temperature) or at a temperature higher than 50° C., or about 80° C. to 180° C., or about 100° C. The calendering can be performed before printing (also referred to as pre-calendering) on the functional paper, after printing on the functional paper (also referred to as post-calendering), or both.

Functional paper may be made using any suitable papermaking process. For example, the functional paper can be formed using a Fourdrinier paper machine equipped with a size press and a calendering device. In another non-limiting example, the functional paper can be formed by applying a sizing solution on a size press or a coater followed by calendering the paper roll or sheet formed on a Fourdrinier paper machine. In other non-limiting examples, the functional paper can be formed by calendering a paper roll or sheet formed on a Fourdrinier paper machine equipped with a size press. A functional paper made by a continuous process, such as a paper machine, can have directionality. The Machine Direction (MD) of the functional paper corresponds to the direction the wire of the machine travels. The Cross Direction (CD) of the functional paper refers to the direction perpendicular to the direction the wire travels. Some physical properties of the functional paper, such as the tensile, will have different values in the MD versus CD. The MD/CD ratio can be about 1.05 to 3, about 1.1 to 2.0 or about 1.2 to 1.6.

The functional paper may include a surface treatment or composite treatment. As used herein, "composite treatment" refers to embodiments in which a sizing solution is added to fiber slurry or sprayed or applied using size press to form a composite treated paper. In an example, the functional paper is formed using a sizing solution containing starch as a surface treatment. In some embodiments, precipitated calcium carbonate (PCC) filler, wet end starch, and internal size is added into the fiber slurry and formed into the web using a Fourdirinier paper machine. In some embodiments, ethylated starch is applied using a size press. In some embodiments, an additive is provided to the starch composition. Additives can include e.g. a monovalent, divalent, or multivalent salts, a cross-linking agent such as citric acid, a polymeric surface sizing agent such as anionic, amphoteric or cationic polymer-based acrylic copolymers, styrene-acrylic dispersions, or styrene-maleic anhydride, and combinations thereof.

In some embodiments, the sizing solution contains ethylated starch and salt. In some embodiments, the surface sizing solution contains 90 wt % ethylated starch and 10 wt % NaCl. In some embodiments, the sizing solution contains ethylated starch, salt and a polymeric surface sizing agent. In some embodiments, the surface sizing solution contains 85 wt % ethylated starch, 10 wt % NaCl and 5 wt % acrylic copolymer (Basoplast®).

In various embodiments, the functional paper can be printed with conductive inks to form a flexible electronic. The functional paper can be printed using flexo, gravure, or an inkjet printing method using a water-based metal inks or other conductive inks followed by drying, curing, or calendering. For example, the functional paper can be printed using such as an inkjet printer with standard water-based silver ink and sintered at 90° C., 120° C. and 150° C. for about one minute. In another non-limiting example, the functional paper can be printed using a gravure printing system along with such as a water-based silver ink and cured (such as at about 150° C. for about 1 minute). In other embodiments, the functional paper can be printed using a gravure printing system with such as a water-based copper or gold ink and cured about 50° C. to 150° C. for about 1 to 15 minutes. In other embodiments, the functional paper can be printed using a gravure printing system with such as carbon-based conductive inks and cured at low temperature. In other embodiments, the functional paper can be printed using a gravure printing system with such as a polymeric-based conductive inks such as poly(3,4-ethylenedioxythiophene) polystyrene sulfonate (PEDOT:PSS) and cured at low temperature.

Advantageously, the functional papers described herein can be used as an alternative substrate to conventional, non-renewable materials such as PET films. The functional paper can be manufactured at a significantly lower final cost for use in flexible hybrid-printed electronics such as displays, sensors, electroluminescent diodes, OLEDs, batteries, RFID antennae, solar cells, etc.

When compared to heavy coated paper, the functional paper of the present disclosure has a lower thickness, higher substrate flexibility, and durability. It can also have comparatively reduced fold cracking, dusting, etc. When compared to papers with coating and extruded plastic, the functional paper of the present disclosure has less or no delamination or blistering at high temperatures. At high temperatures, the polyextruded paper with and without coating can cause blistering when sintered at high temperature or under extended dwell time (see FIG. 1, blisters are circled). Advantageously, although the roughness (e.g. Sheffield roughness) may be higher than traditionally coated functional papers, surprisingly the papers have comparable performance (e.g. conductivity, resistivity). This indicates that the combinations of factors such sizing solution formulation and methods of making produce unexpected results.

In comparison to other substrates such as heavy coated paper and PET films, the functional paper of the present disclosure can allow for faster printing when using conductive inks due the absorptive paper substrate and high temperature sintering.

When printed with a conductive ink, the flexible ink has a low electrical resistance. Advantageously, higher conductivity than traditional substrates can be achieved with the application of surface sizing solution and with higher volume (measured in billion cubic microns per sq. inch or BCM or bcm) anilox roller. Advantageously, the functional papers have a high degree of uniformity, demonstrating negligible variations in resistivity, comparable with the resistivity of heavy coated commercial papers.

In some embodiments, the electrical resistance can be from about 7.0 Ω/cm to 0.5 Ω/cm, depending on the amount and type of ink used. For example, using a water-based silver ink, the resistance can be from about 1.3 Ω/cm to 4.3 Ω/cm (8 bcm ink), about 1.0 Ω/cm to 5.0 (12.25 bcm ink), or about 0.5 Ω/cm to 3.2 Ω/cm (21 bcm ink).

The present disclosure also includes flexible hybrid electronics including a functional paper substrate as described above. The flexible hybrid electronics of the present disclosure are thin, low cost, and sustainable in comparison to traditional substrates.

The functional paper and flexible hybrid electronics including the same can have a high print durability, shown in both dry and wet rub scratch tests. Due to the post-calendering and a lack of heavy coating on the paper, ink particles can become embedded in the paper layer as a composite.

In various embodiments, the flexible hybrid electronics of the present disclosure can be included in displays, sensors, electroluminescent diodes, OLEDs, batteries, RFID antennae, and the like. In some embodiments, an adhesive backing can be included for applications such as packaging labels.

Embodiments of the present disclosure include a method of making a functional paper as above, wherein the method includes forming a paper from a slurry. The slurry can include about 10 wt % to 90 wt % cellulosic fibers and about 1 wt % to 25 wt % sizing solution per total weight of the slurry fibers. The method further includes printing a conductive ink onto the paper. The paper can be calendered at a temperature greater than 50° C. either before printing, after printing, or both.

In some embodiments, the method can include one or more of applying an internal sizing solution at a wet end of a paper machine, applying a surface sizing solution at a dry end of the paper machine, and applying a surface treatment solution to the paper using a rod coater to form sized and coated sheets prior to printing a conductive ink onto the paper.

EXAMPLES

Paper is a fibrous sheet prepared from cellulosic materials through the chemical and mechanical modification of wood. The paper may include functional additives and surface coatings to enhance physical, optical, and barrier characteristics such as smoothness, porosity, wettability and adhesion, thermal and mechanical stability, moisture and chemical resistance, and transparency and clarity. Furthermore, the paper may include special treatments to impart electrical and conductive properties. Paper seems well suited for flexible hybrid electronic applications because it can be produced with a broad range of caliper, basis weight, stiffness, and barrier properties. However, papers for flexible hybrid electronics pose a different set of challenges than for graphics printing applications. Paper must be dimensionally stable to meet the more stringent registration and finer resolution requirements. Also, depending on the inks and manufacturing methods, the paper substrate must be compatible with the carrier fluids within the inks and tolerant to high temperatures. Some of the ink chemistries are very sensitive to the functional groups present on the surface of the substrate. Two other key paper properties are smoothness and porosity. Other important properties are thermal and mechanical stability, resistance to moisture, gas and vapor transmission, and solvents. In addition, surface smoothness, surface energy, optical transparency, commercial availability, and cost must be considered. As with most materials, cost increases with substrate material property demands.

Having described the embodiments of the disclosure, in general, the following examples describe some additional embodiments. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Examples 1-4

Example 1: The functional paper contains about 50 wt % softwood and 50 wt % hardwood cellulose fibers. Both the softwood and hardwood fibers were refined separately. The functional paper contains 20 lbs/ton internal starch and 1.2 lbs/ton internal sizing agent. Further, the functional paper includes ethylated starch solution at 40 lbs/ton on the surface. The functional paper was made using a Fourdrinier-style papermaking machine at a basis weight target of 66 lbs/3300 sq. ft.

Example 2: The functional paper contains 28 wt % softwood and 72 wt % hardwood cellulose fibers. Both the softwood and hardwood fibers were refined separately at 100 and 74 kWH/ton respectively. A portion of hardwood (~12 wt % of total fibers) was highly refined at 190 kWH/t. The functional paper contains 4.5 wt % precipitated calcium carbonate on the weight of fibers, 10 lbs/ton internal starch, and 3.9 lbs/ton internal sizing agent. Further, the functional paper includes ethylated starch solution at 60 lbs/ton on the surface. The functional paper was made using a Fourdrinier-style papermaking machine at a basis weight target of 43.5 lbs/3300 sq. ft Example 3: The functional paper from Example 1 is further pre-calendered at 1000 psi, 212° F., and 6 passes to enhance surface smoothness without significantly reducing the porosity.

Example 4: The functional paper from Example 2 is further pre-calendered at 1000 psi, 212° F., and 6 passes. Properties of the functional papers described in Examples 1-4 are shown in Table 1, below.

TABLE 1

| Sample ID | Pre-calendering | Caliper (μm) AVG. | SD | Roughness (μm) AVG. | SD | Gurlesy Porosity (Sec.) AVG. | SD | Comments |
|---|---|---|---|---|---|---|---|---|
| 1 | No | 112 | 1 | 7.2 | 0.34 | 33.1 | 2.4 | Example 1 |
| 2 | No | 76.33 | 0.58 | 6.04 | 0.09 | 45.37 | 6.72 | Example 2 |
| 3 | Yes | 101 | 1.73 | 3.6 | 0.16 | 62.47 | 8.49 | Example 3 |
| 4 | Yes | 65.67 | 1.53 | 2.78 | 0.06 | 179.07 | 62.7 | Example 4 |
| Control | Yes | 191.2 | 1 | 3.31 | 0.08 | 123 | 5.13 | Heavy coated commercial control paper |

Figure 2A:
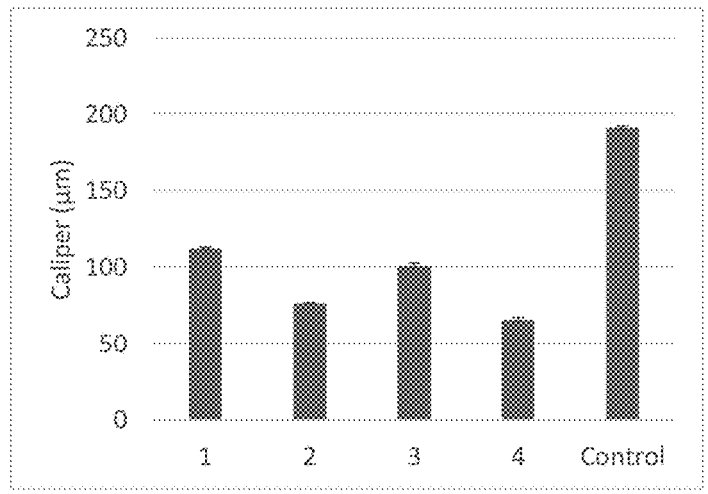
FIGS. 2A-2C provide graphs illustrating functional paper properties of Examples 1-4, in accordance with embodiments of the present disclosure.
Figure 2B:
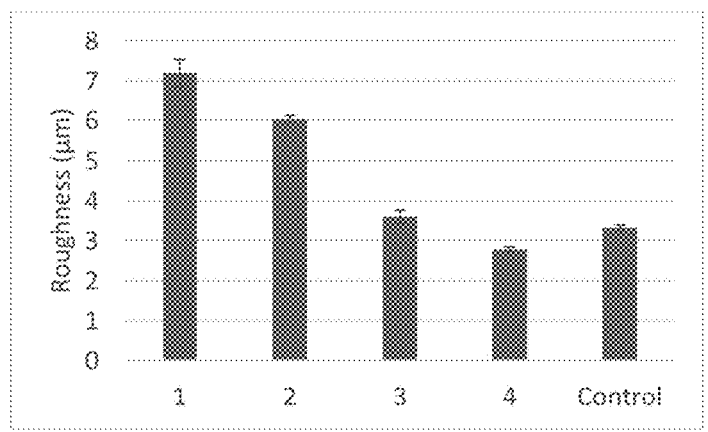
Figure 2C:
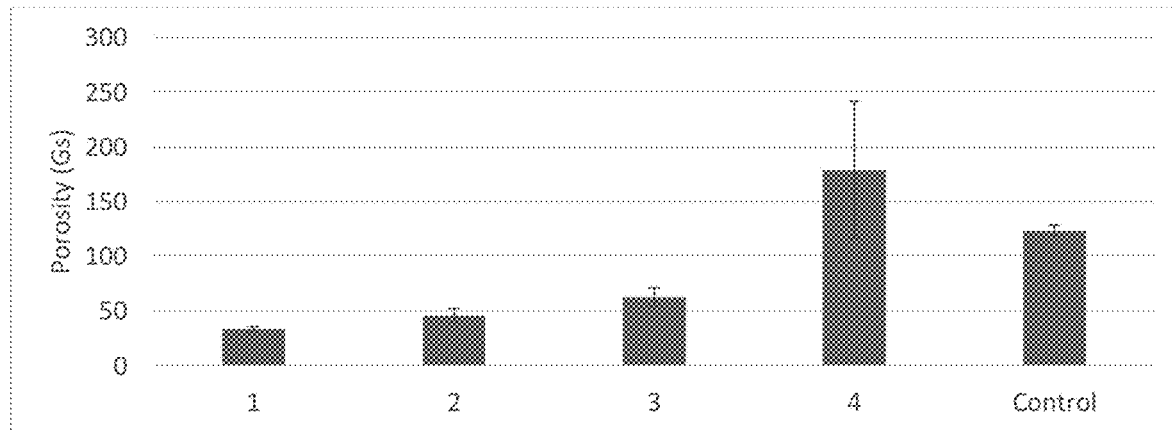

FIG. 2A shows that the all the example substrates are thinner than the control paper. Comparing the paper IDs 1 with 3 and 2 with 4, it is clear that the caliper and roughness decrease after calendering of the papers. The papers become denser, and the porosity decreases. FIG. 2C shows that the porosity number (time taken for 100 ml air to pass through) increases with calendering. Thus, the paper becomes less porous with calendering. Except ID 4, all the papers have higher porosity (lower time) than control. The lower porosity can provide better hold out for the ink particles on the surface, resulting in better electrical conductivity. However, the durability of the print may deteriorate when run against other surfaces or folded.

The developed functional paper in Examples 1 to 4 were used for electronics printing using a gravure QD proofer with a 60% wt. silver (Ag), water-based nano silver ink (PFI-600, Novacentrix®). After printing, the ink was sintered (cured) at 140° C.-160° C. for 2 minutes and resistivity was measured and compared with control (heavy coated paper). First printing was conducted on the control paper using multiple anilox rollers (2.1, 3.51, 8.0, and 21 bcm). The prints with 8 and 21 bcm anilox roller had a good appearance but the ink usage was high with 21 bcm. Therefore, 8 bcm anilox was selected for printing on the Example 1 to 4 papers to minimize ink usage while maintaining good printability with the PFI-600 silver nanoparticle ink. The resistivity data is shown in Table 2.

TABLE 2

Functional paper electronics properties before surface treatments.

| Sample # | Calendering | Resistance per cm (Ω/cm) Avg | Stdev | Comments |
|---|---|---|---|---|
| 1 | No calendering | 8.43 | 5.42 | Example 1 |
| 2 | No calendering | 5.89 | 2.70 | Example 2 |
| 3 | Pre-calendering only | 2.49 | 0.46 | Example 3 |
| 4 | Pre-calendering only | 1.57 | 0.26 | Example 4 |
| 5 | Post-calendering only | 1.23 | 0.26 | Example 5 |
| 6 | Post-calendering only | 1.06 | 0.29 | Example 6 |
| 7 | Pre- and post- calendering | 1.27 | 0.34 | Example 7 |
| 8 | Pre- and post- calendering | 0.80 | 0.27 | Example 8 |
| Control | Na | 0.78 | 0.06 | Heavy coated commercial control paper |

Examples 5-10

Examples 5-8 are further modifications of the examples 1-4. The printed samples in the examples 1, 2, 3, and 4 were post-calendered to obtain examples 5, 6, 7, and 8 respectively. Specifically, Example 5 is derived from Example 1 printed paper after post-calendering using 1 pass at 1000 PSI. Example 6 is derived from example 2 printed paper after post-calendering using 1 pass at 1000 PSI. Example 7 is derived from Example 3 after post-calendering using 1 pass at 1000 PSI. Example 8 is derived from example 4 after post-calendering using 1 pass at 1000 PSI. The roughness of the printed samples is not measured as the values cannot be a compared with unprinted samples. They will vary based on ink film thickness and type of design.

Figure 3:
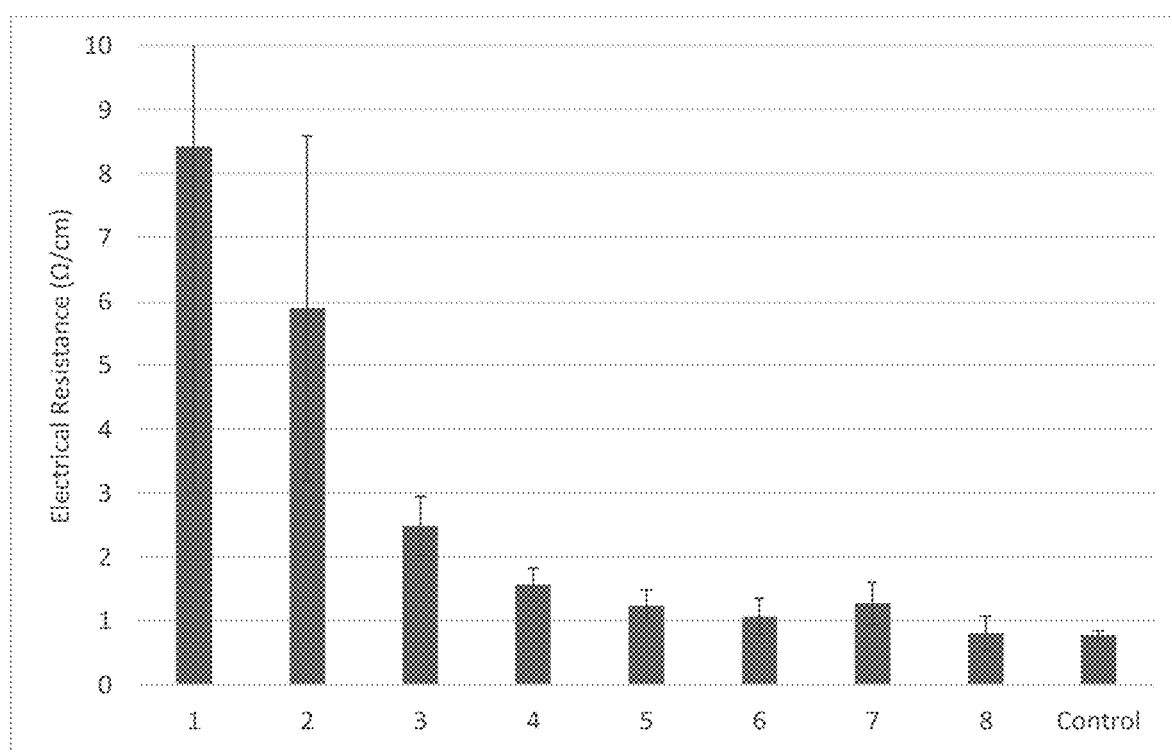
FIG. 3 illustrates electrical resistance of the samples before surface treatments.
Figure 4A:
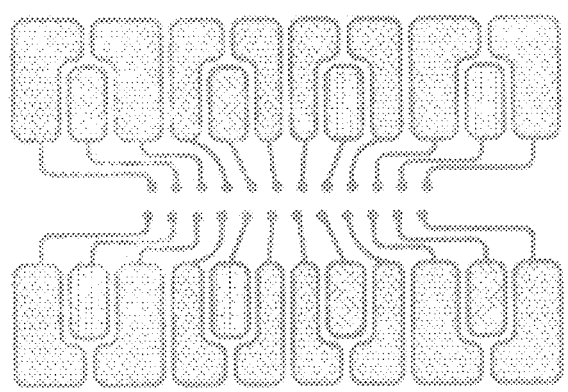
FIGS. 4A-4D show examples of the printed electrical patterns for selected examples (FIG. 4A, Example 1.
Figure 4B:
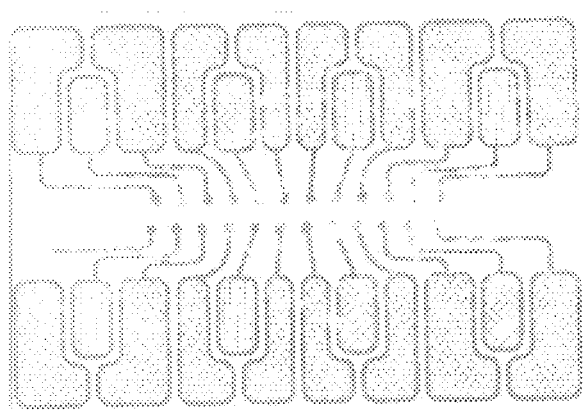
Figure 4C:
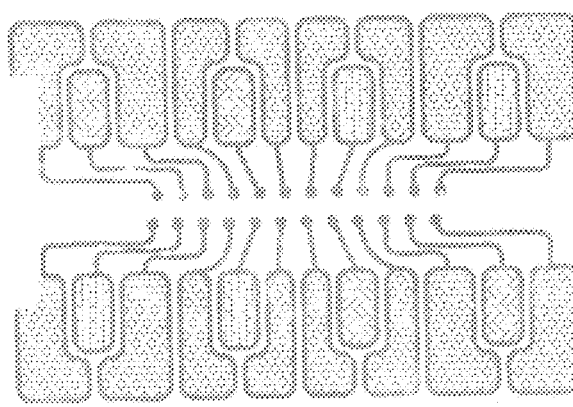
Figure 4D:
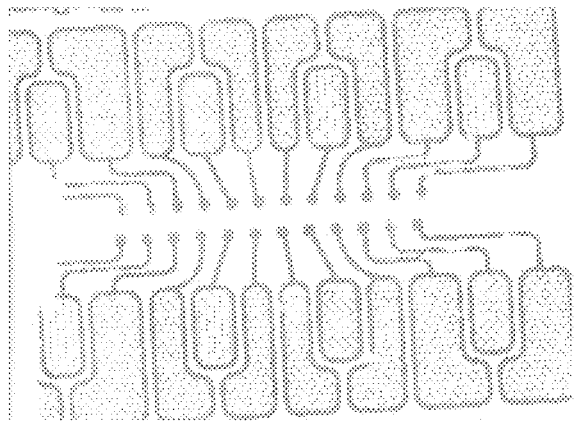

The comparison of electrical resistance for various samples is shown in Table 2 and FIG. 3. The electrical resistance decreased with the decreased in porosity (increased Gurley time) and roughness (higher smoothness). Pre-calendering or post-calendering showed significant reduction in the electrical resistances of the printed samples. Combination of both pre- and post-calendering showed lower electrical resistivity for Example 8, essentially matching the performance of control sample. However, the results indicate that pre- or post-calendering might be sufficient from an economic standpoint point to achieve lower electrical resistances. The Example 2 paper formulation and its mechanically treated derivatives (Examples 4, 6, & 8) gave lower electrical resistance (i.e., better electrical conductivity) when compared to Example 1 paper formulation and its derivatives (Examples 3, 5, & 7). FIGS. 4A-4D show examples of the printed electrical patterns for selected examples (FIG. 4A, Example 1; FIG. 4B, Example 2; FIG. 4C, Example 3; FIG. 4D, Example 4)

Example 9: The functional paper from Example 1 is further surface treated (also referred to as surface sized) with various surface treatment formulations which include ethylated starch, monovalent salts such as sodium chloride (NaCl), divalent salts such as calcium chloride ($CaCl_2$), trivalent salts such as aluminum chloride ($AlCl_3$), and surface sizing agents such as acrylic copolymer, as shown in Table 3. The conductive ink patterns were printed on the surface treated samples.

Surface treated papers from Example 9 were pre-calendered for 1 pass at 1000 PSI, then printed and post-calendered for 1 pass at 1000 PSI wherever described.

Example 10: The functional paper from Example 2 was further surface treated (also referred to as surface sized) with various surface treatment formulations which include ethylated starch, monovalent salts such as sodium chloride (NaCl), divalent salts such as calcium chloride ($CaCl_2$), trivalent salts such as aluminum chloride ($AlCl_3$), and surface sizing agents such as acrylic copolymer, as indicated in Table 3.

Surface treated papers from Example 10 were pre-calendered for 1 pass at 1000 PSI, then printed with conductive ink and post-calendered for 1 pass at 1000 PSI wherever described.

Surface treatments were performed on Examples 1 and 2 to obtain Examples 9 and 10 respectively. It is possible to surface treat Examples 3, and 4, but it is not a common practice to calender the paper substrates before surface treatment. Similarly, it is possible to coat the examples 5, 6, 7, and 8; however, this will embed the printed layer beneath the surface treatment and make it inaccessible. Also, as the printing is already done in the examples 5, 6, 7, and 8; the coatings will not add any benefit to the ink distribution, anchoring, or electrical conductivity.

The surface treatment formulations are shown in Table 3. Surface coat weights and resulting surface energies are shown in Table 4 and Table 6. Surface roughness and electrical properties of examples 9 and 10 are shown in tables 5, 7, and 8. The FIGS. 5, 6, 7, 8, 10, 11, 12, 13, 15, and 16 assist the tabulated data in understanding the surface treatments and their interaction with chosen substrates.

FIGS. 9A-9F show the demonstration of printed electrical ink pattern on uncoated surface and different treated surfaces captured using camera. (FIG. 9A) Example 1; (FIG. 9B) Example 9s; (FIG. 9C) Example 9sm; (FIG. 9D) Example 9sd; (FIG. 9E) Example 9st; (FIG. 9F) Example 9ss.

FIGS. 14A-14F show the demonstration of printed electrical ink pattern on uncoated surface and different treated surfaces captured using camera. (FIG. 14A) Example 2; (FIG. 14B) Example 10s; (FIG. 14C) Example 10sm; (FIG. 14D) Example 10sd; (FIG. 14E) Example 10st; (FIG. 14F) Example 10ss.

Figure 5:
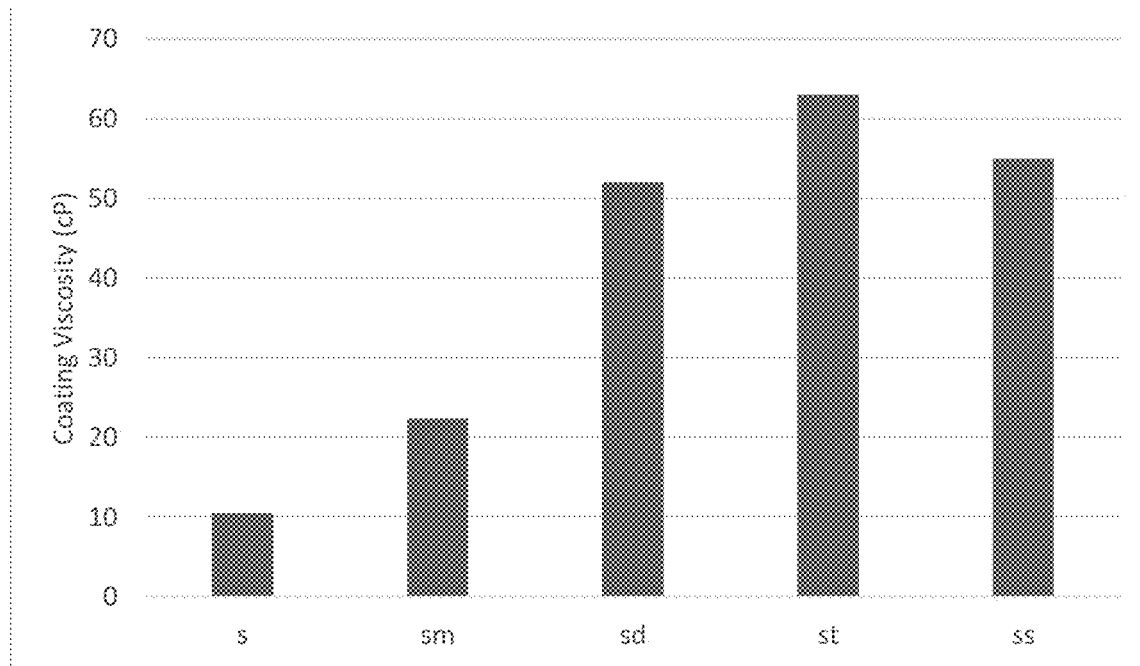
FIG. 5 provides a graph illustrating coating viscosity of various examples. 10% solids were used for the formulations.
Figure 6:
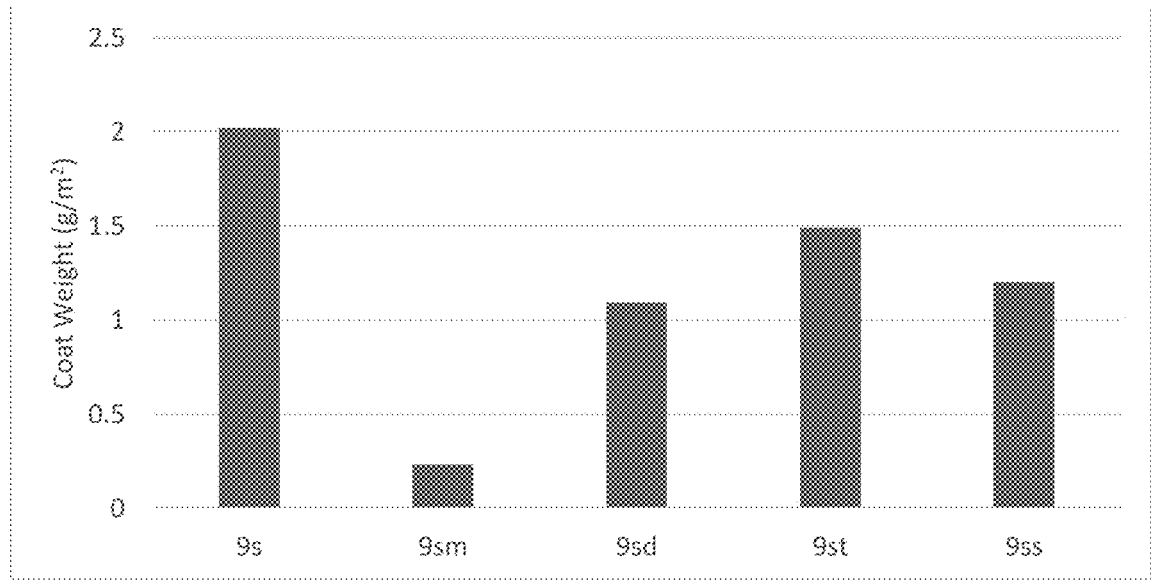
FIG. 6 provides a graph of coat weight of different formulations using the Example 9 formulation.
Figure 7:
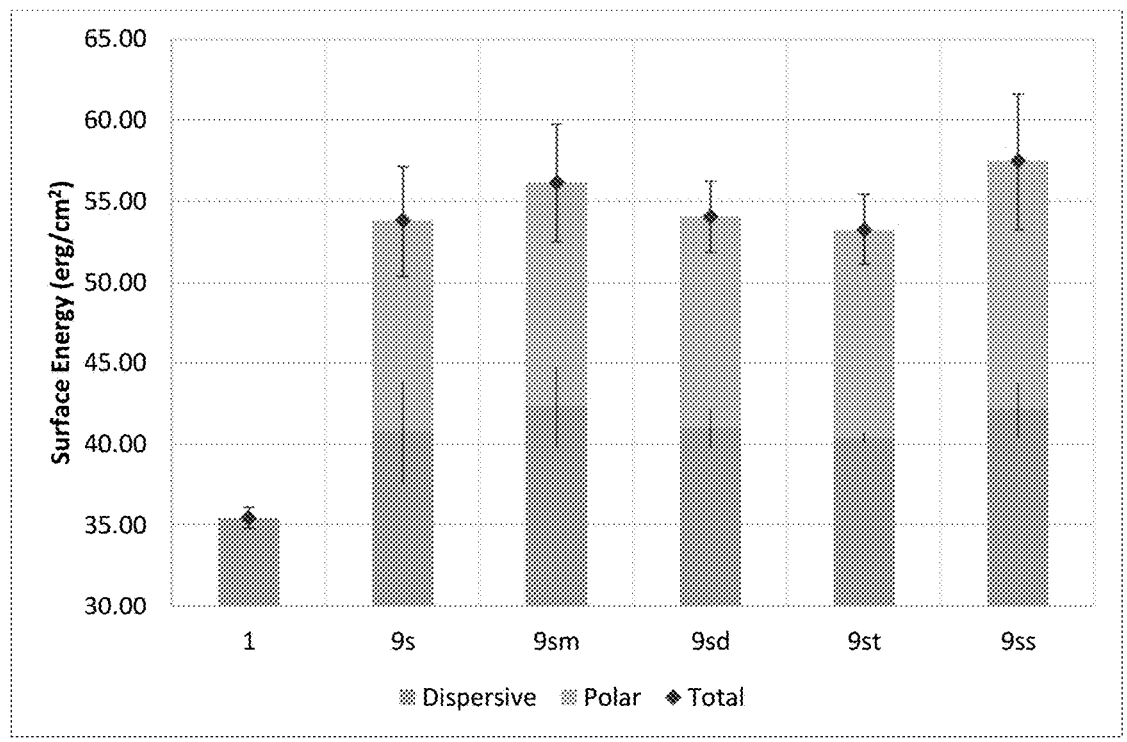
FIG. 7 is a graph of comparison of surface energies for Example 1 and different surface treatment formulations of Example 9.

The data in Table 3 and FIG. 5 shows that the addition of the salts increase the viscosity of the surface treatment. The same effect is seen for the addition of the surface sizing agent. This can affect the coat weight as discussed in later paragraphs.

The coat weight (FIG. 6) for the starch surface treatment is supposed to be lower for the substrate, due to lower viscosity of the starch surface treatment. However, the data indicates that addition of the salt or surface sizing agent affected the acceptance of the surface treatment on the substrate for Example 9. For the additives in the surface treatment, the viscosity trend is followed by the coat weight for Example 9. Thus, the surface treatment material's cohesive forces appear to follow the viscosity trend by the additives.

The surface energies of the surface treatment samples increase with the coatings. The polar component of the surface energy (FIG. 7) increases from negligible to a considerably high amount. Also, the dispersive surface energy of the coated surfaces (Example 9) is much higher than the uncoated surface (Example 1).

Figure 8:
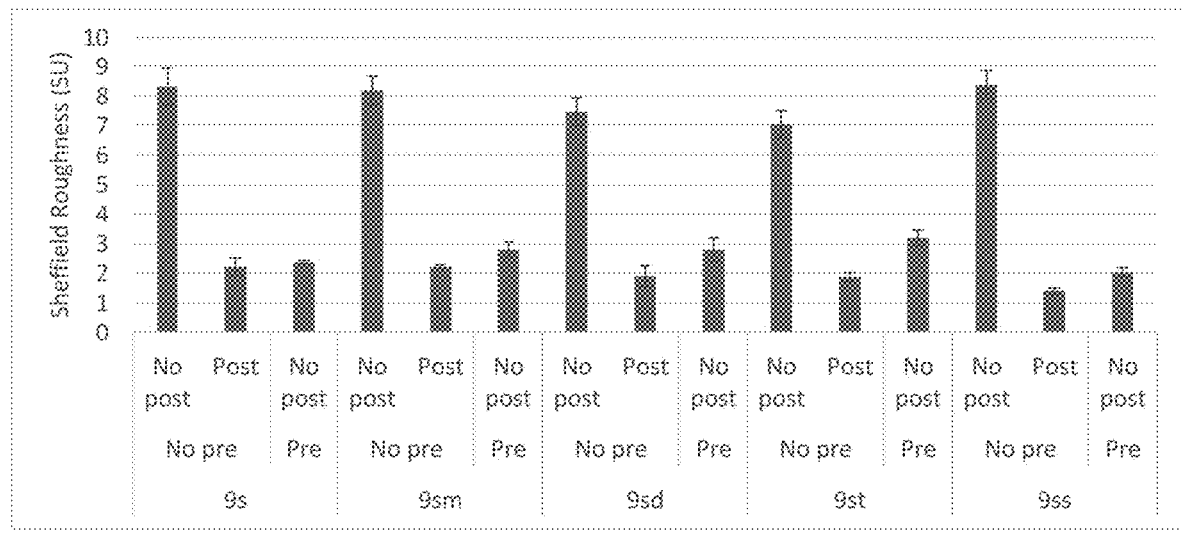
FIG. 8 shows the effect of surface treatment formulations and calendering conditions on the surface roughness for Example 9. (No pre=no pre calendering, Pre=Pre-calendering, No post=no post calendering, Post=post calendering).
Figure 9A:
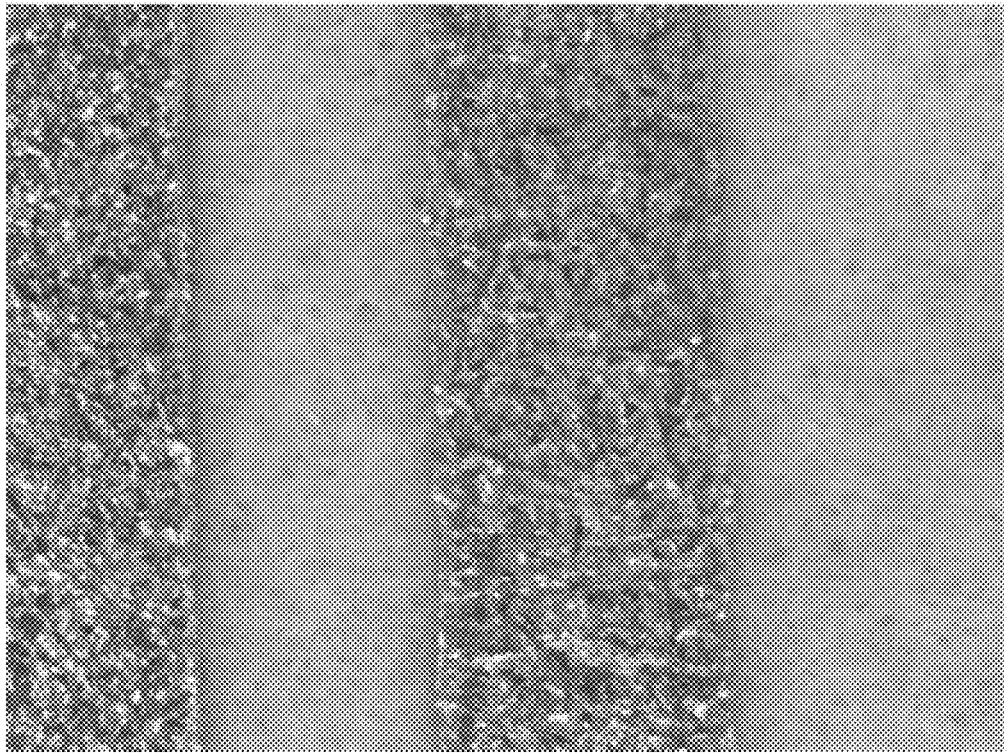
FIGS. 9A-9F are the camera images of printed electronic patterns under magnification for Example 1 and different surface treatment formulations of Example 9 (FIG. 9A, Example 1.
Figure 9B:
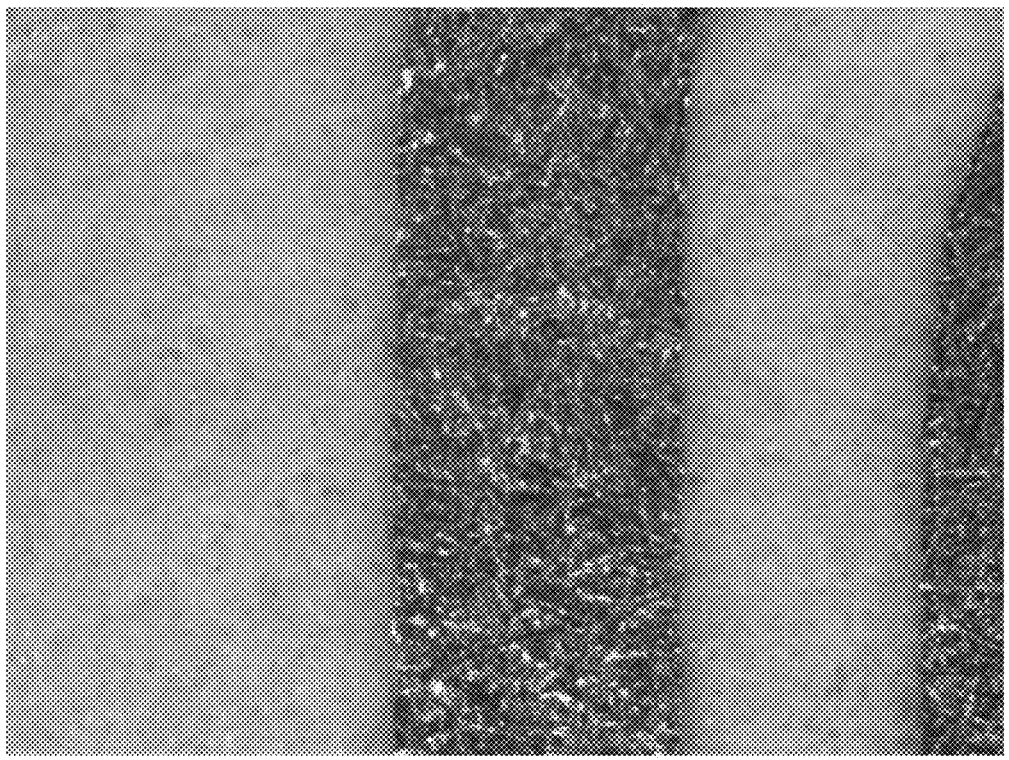
Figure 9C:
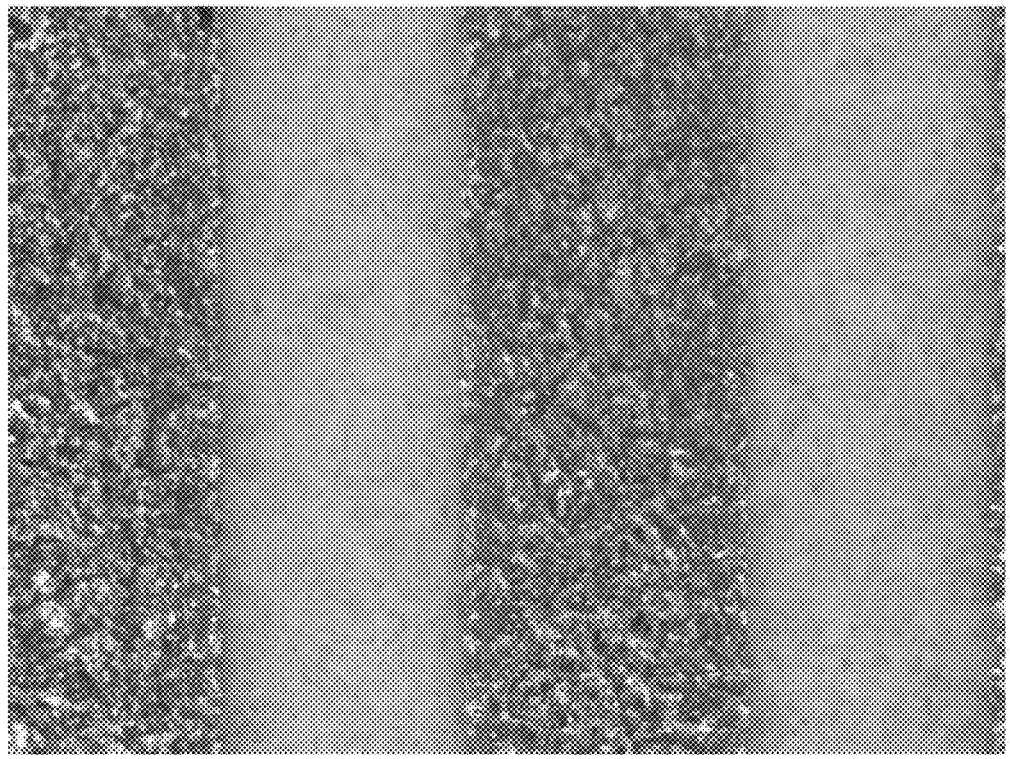
Figure 9D:
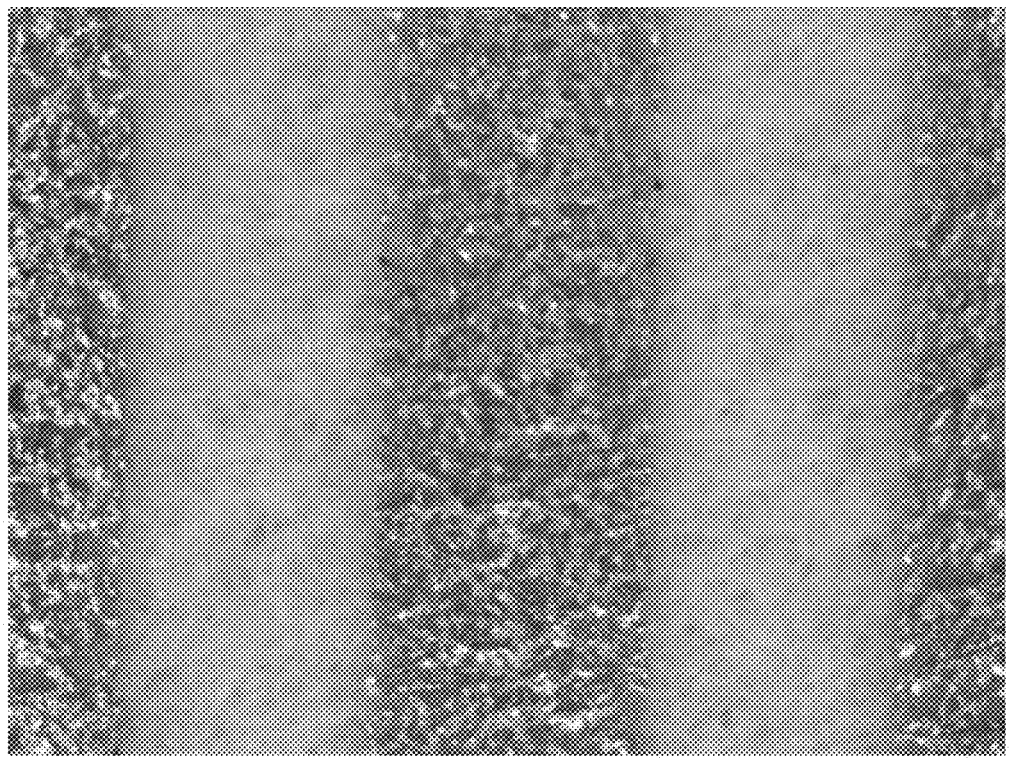
Figure 9E:
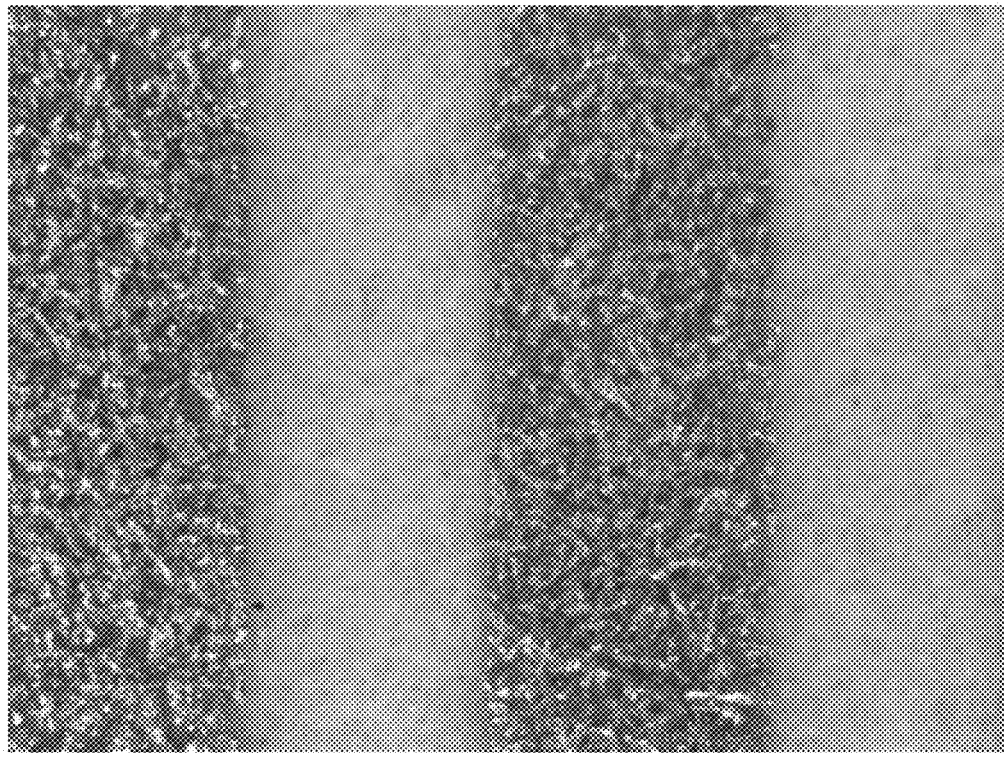
Figure 9F:
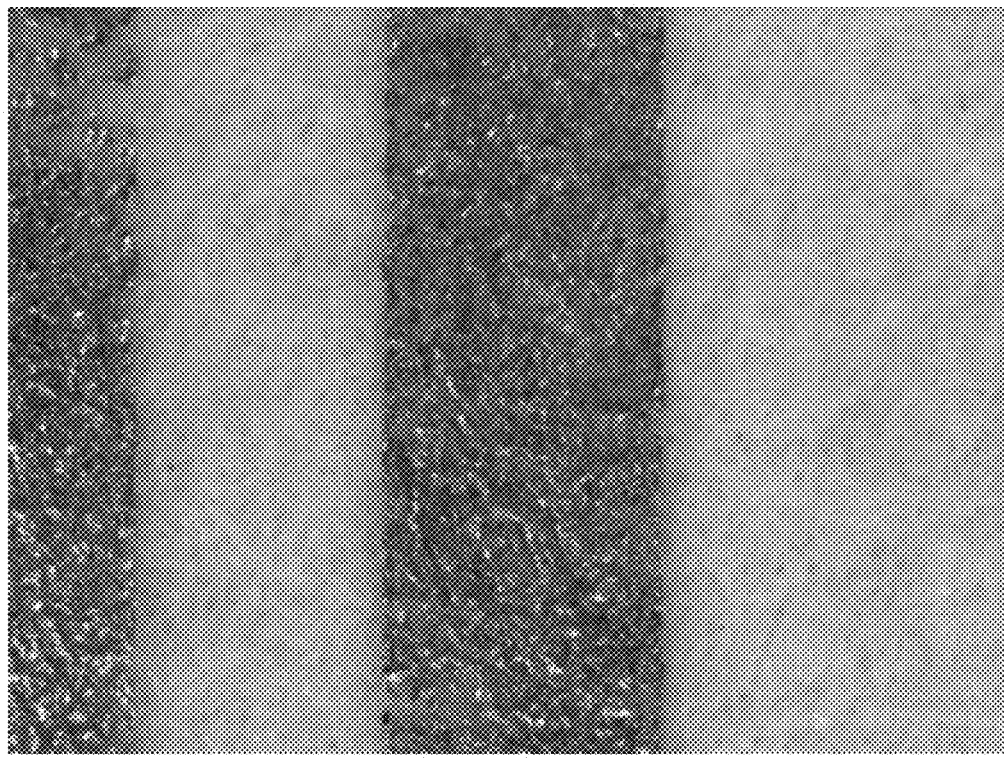

When the surface treated papers are subject to mechanical treatment of calendering, the roughness drops considerably. There is better smoothness (lower roughness) for the post-calendered papers of Example 9 as compared to pre-calendered, (FIG. 8). The smoother surface is obtained with surface sizing agent.

Figure 10:
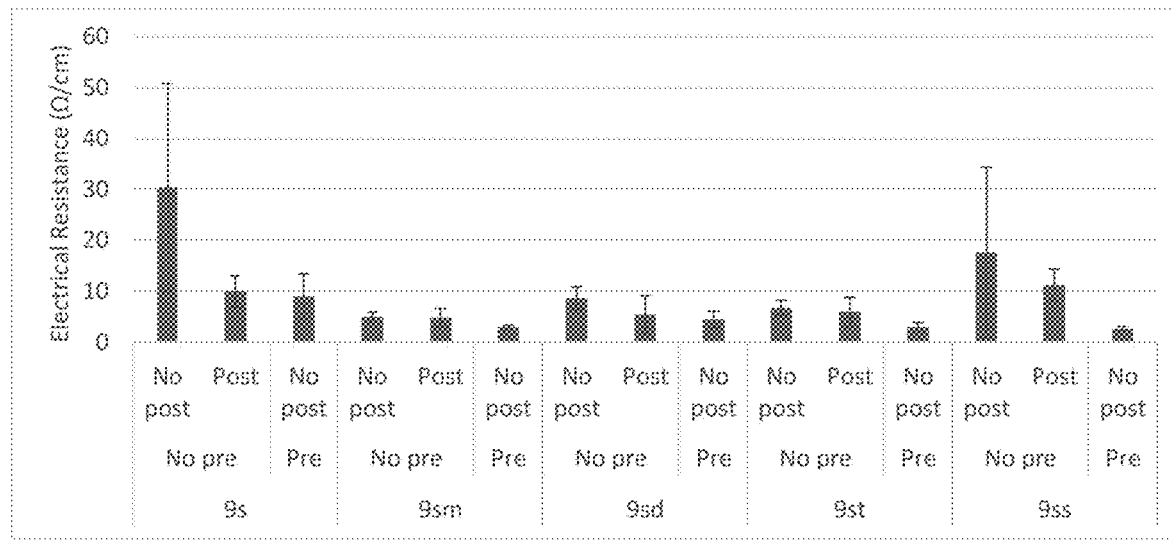
FIG. 10 shows the effect of surface treatment formulations and calendering conditions on the electrical resistance for Example 9. (No pre=no pre calendering, Pre=Pre-calendering, No post=no post calendering, Post=post calendering).

These surfaces, when printed with electrically conductive ink, show the tendency of lower electrical resistance for added salts (FIG. 10). The pre-calendering is better than the post calendering for electrical conductivity for the example 9. Similarly, the ID 9ss, showed electrical conductance comparable to IDs 9sm, 9sd, and 9st in pre-calendering states. Therefore, it can be concluded that addition of salts and surface sizing agent along with mechanical treatment before printing are beneficial. Post-calendering is not as useful in these cases.

Figure 11:
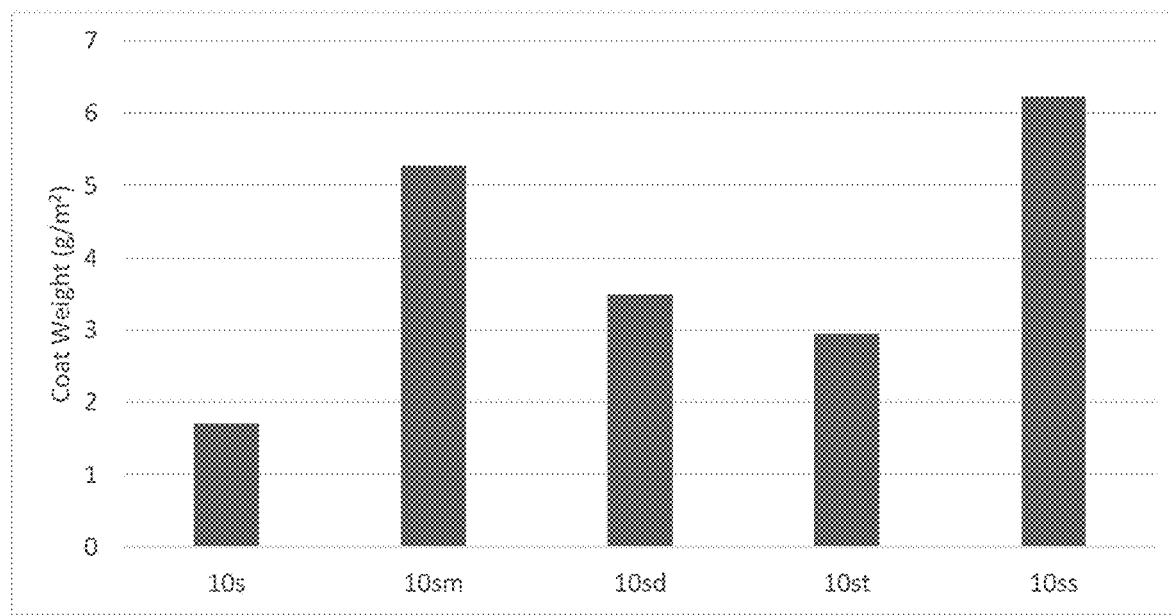
FIG. 11 shows the coat weight of different formulations on Example 10.
Figure 12:
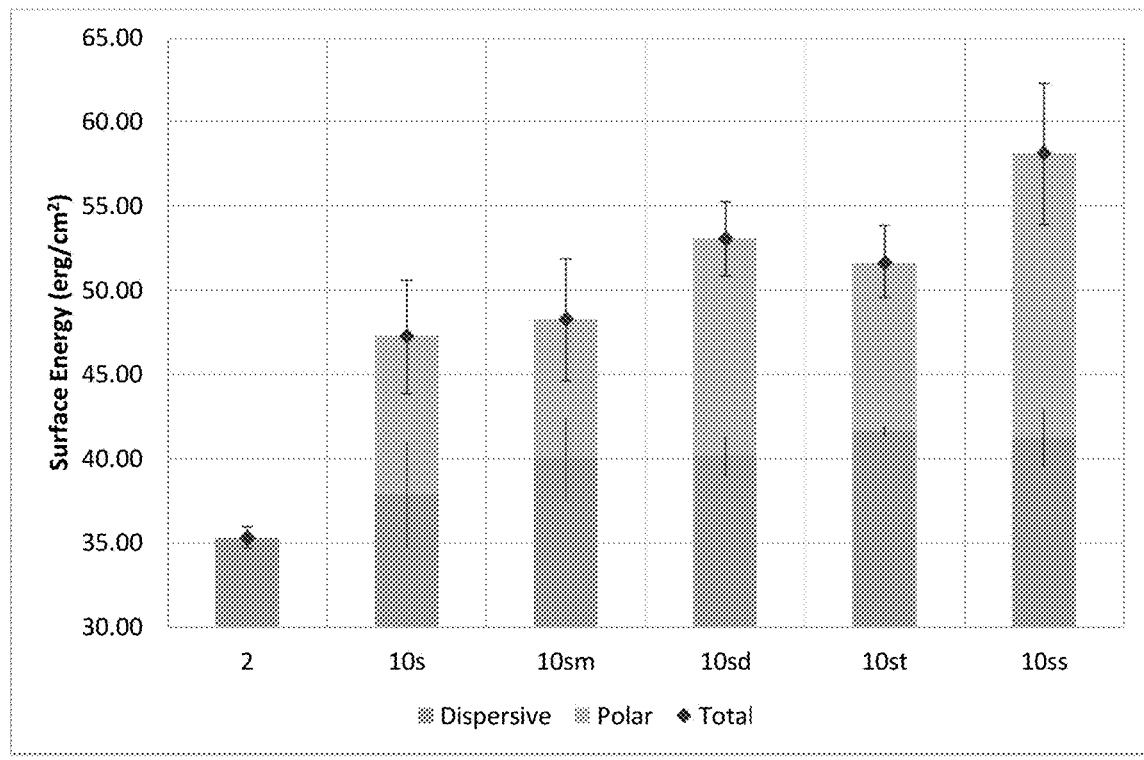
FIG. 12 is a graph of comparison of surface energies for Example 2 and different surface treatment formulations of Example 10.

For the Example 10 substrate, the surface treatments showed a different behavior as compared with the Example 9 substrate. The additives caused more pickup of the surface treatment and thus the increased coat weight than the simple starch (FIG. 11). However, the valency of the metal ions in the salts reversed the trend. The monovalent salt caused more coat weight than for divalent and trivalent salts for Example 10 substrate. Overall, the surface treatment acceptance is much better for Example 10 substrate than the Example 9 substrate, though the trend reverses for addition of different salts.

The surface energies of the surface treatment samples increase with the coatings. The polar component of the surface energy (FIG. 12) increases from negligible to a considerably high amount. Also, the dispersive surface energy of the surface treatment surfaces (Example 10) is much higher than the uncoated surface (Example 2). In comparison to the Example 9, the addition of salt does not increase surface energy of Example 10 to the same levels. The polar component of surface energy is higher in Example 9 than in Example 10. Thus, the ionic species concentration is higher in Example 9 than in Example 10 (except for ID 10ss).

Figure 13:
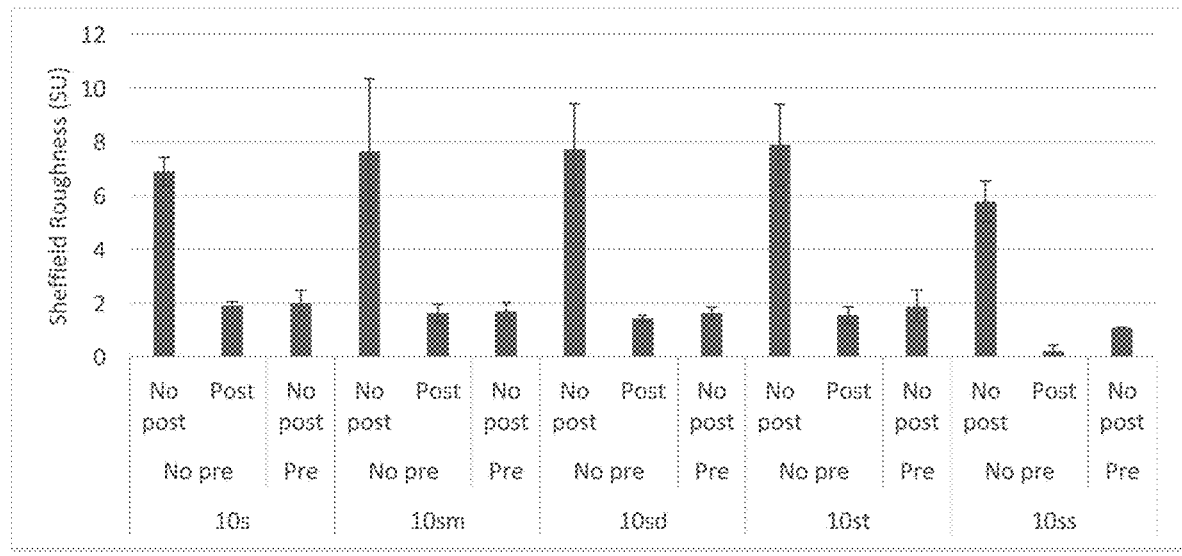
FIG. 13 shows the effect of surface treatment formulations and calendering conditions on the surface roughness for Example 10. (No pre=no pre calendering, Pre=Pre-calendering, No post=no post calendering, Post=post calendering).
Figure 14A:
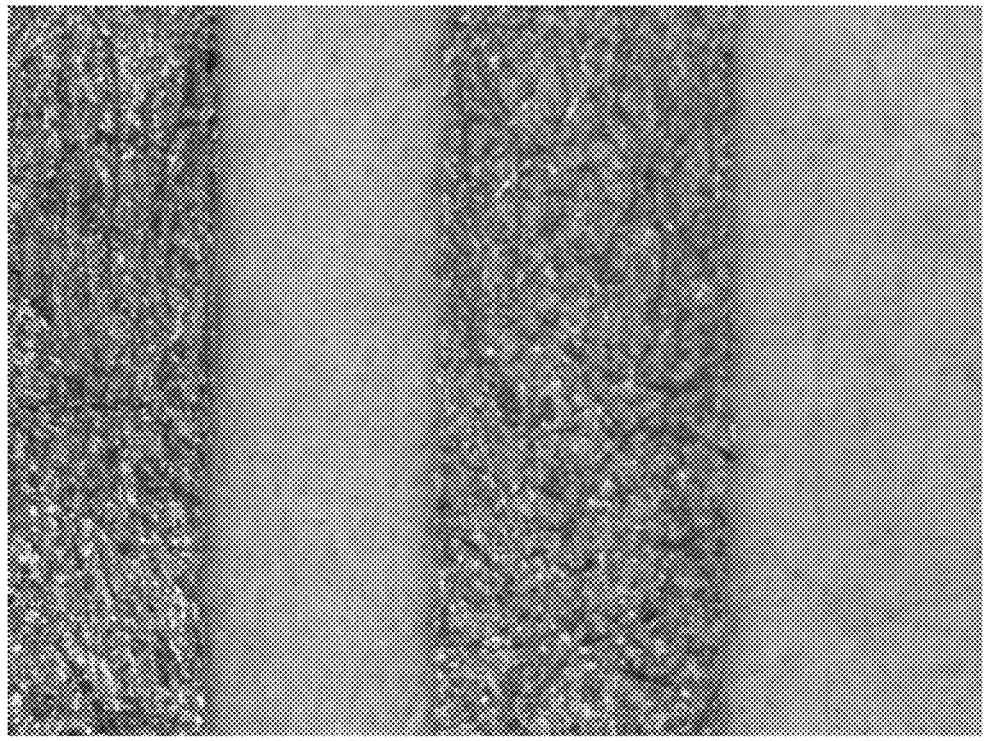
FIGS. 14A-14F are the camera images of printed electronic patterns under magnification for Example 2 and different surface treatment formulations of Example 10 (FIG. 14A, Example 2.
Figure 14B:
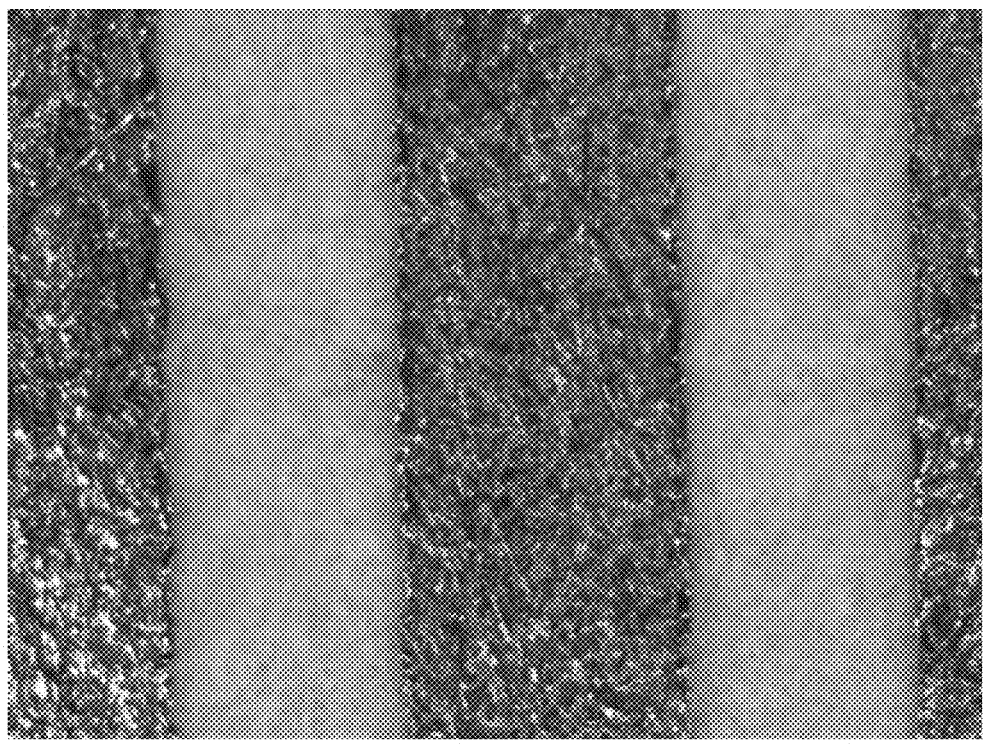
Figure 14C:
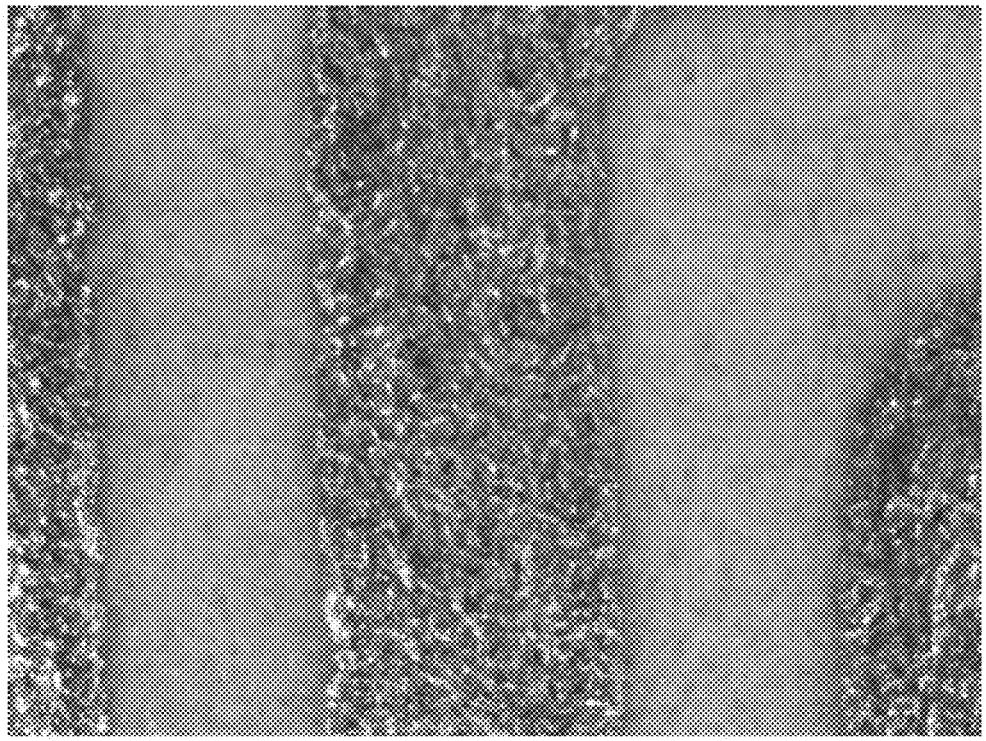
Figure 14D:
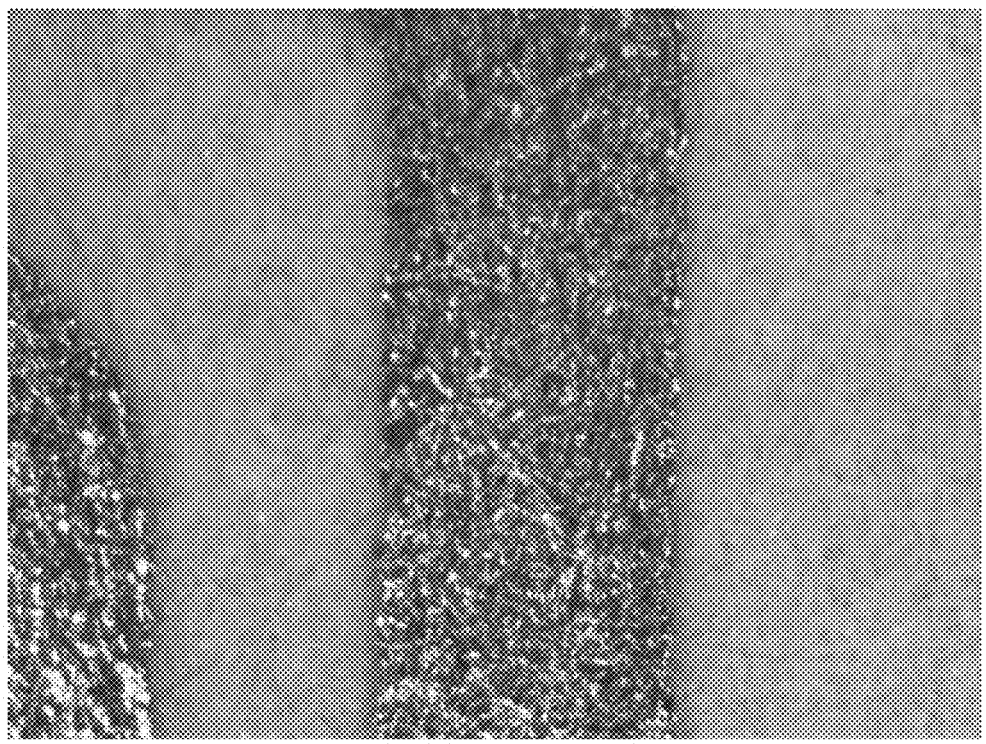
Figure 14E:
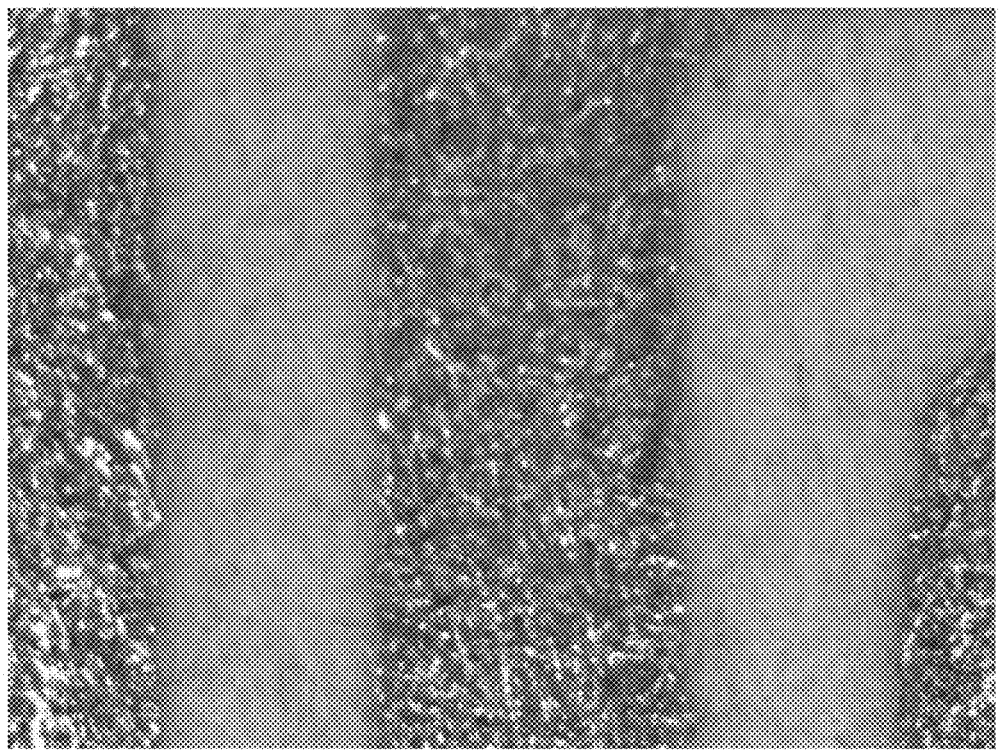
Figure 14F:
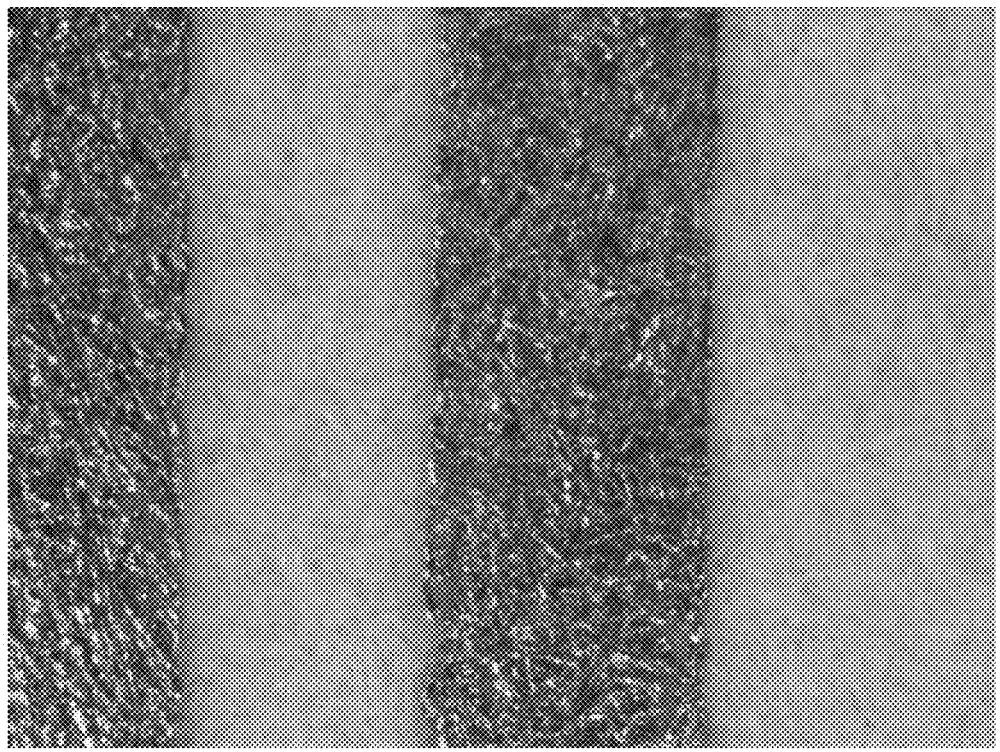
Figure 15:
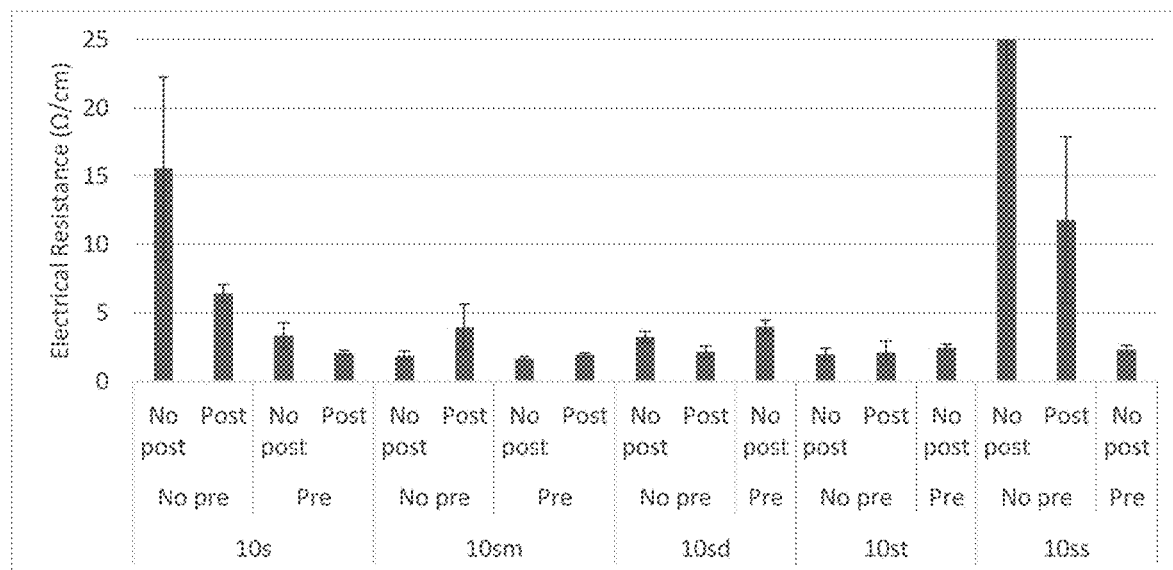
FIG. 15 shows the effect of surface treatment formulations and calendering conditions on the electrical resistance for example 10. (No pre=no pre calendering, Pre=Pre-calendering, No post=no post calendering, Post=post calendering)
Figure 16:
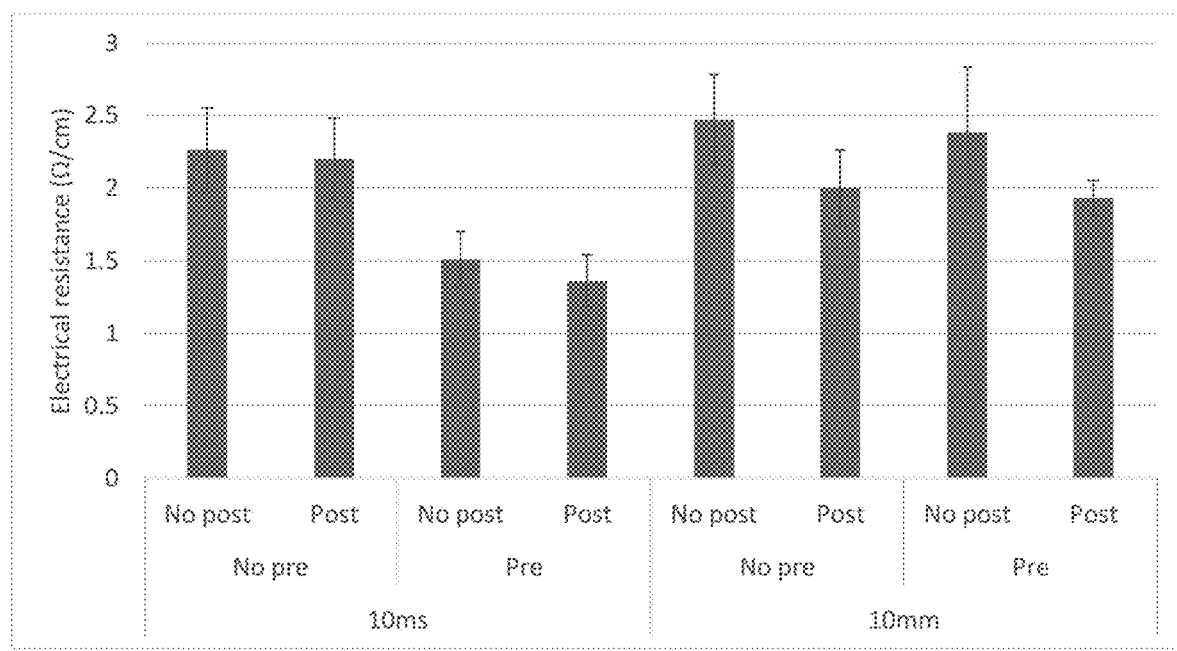
FIG. 16 shows the effect of combination of salt and sizing agent, and increased salt contents on electrical resistance for Example 10. (No pre=no pre calendering, Pre=Pre-calendering, No post=no post calendering, Post=post calendering).

Similar to the substrate of Example 9, the Example 10 substrate shows increased surface smoothness after calendering (FIG. 13). Except for ID 10ss, the pre- and post-calendering does not show a considerable difference in the smoothness.

For Example 10, the trend of the electrical resistance is similar to that of Example 9. The addition of the salts combined with the mechanical treatment increase the conductivity. The pre-calendering alone improves the conductivity as opposed to post-calendering in the ID 10sm. Different valency of the salts show different tendency in combination with the calendering processes. Thus, based on the overall production processes, the salts can be chosen to achieve lower electrical resistance in selective operational conditions. The addition of the surface sizing agent as seen in 10ss, shows a far better electrical conductivity when subjected to pre-calendering only. It should be noted that the measurement of surface roughness of post-calendered samples may not be useful as the ink layer can affect the measurements.

As seen in earlier paragraphs, the monovalent salts caused reduced electrical resistance for the Examples 9 and 10. There was synergistic benefit of surface sizing agent and pre-calendering process for the electrical conductance. Hence, the effect of increased salt and combination of the surface size with salt was tested.

Additional surface treatment formulations for Example 10 include the combination of ethylated starch, increased amount of monovalent salts like sodium chloride, and addition of surface sizing agent like Acrylic copolymer with the monovalent salts like sodium chloride (Table 8). As can be seen from the table, the samples include starch, monovalent salt, and acrylic copolymer with pre-calendaring.

Increasing the salt amounts vs addition of the surface sizing agent show that the addition of the surface sizing agent along with the mechanical treatment of pre-calendering is beneficial. The both pre- and post-calendering in case of 10 ms does not add considerable difference in conductivity and thus pre-calendering can be sufficient for it.

TABLE 3

Surface treatment formulations and viscosities for Examples 9 and 10.

| Sample ID | Surface treatment (10% solids by weight in aqueous medium) | Brookfield low shear viscosity at 100 rpm at room temperature (cP) |
|---|---|---|
| s | Ethylated Starch | 10.5 |
| sm | Ethylated Starch + 10% monovalent salt | 22.4 |
| sd | Ethylated Starch + 10% divalent salt | 52 |
| st | Ethylated Starch + 10% trivalent salt | 63 |
| ss | Ethylated Starch + 5% acrylic copolymer (sizing agent) | 55 |

TABLE 4

Coat weights for papers in Example 1 and Example 9 and respective surface energies.

| Sample ID | Surface treatment | Coat weight (g/m$^2$) | Polar Surface Energy Component (ergs/cm$^2$) | | | Dispersive Surface Energy Component (ergs/cm$^2$) | | |
|---|---|---|---|---|---|---|---|---|
| | | | Avg. | Upper SD | Lower SD | Avg. | Upper SD | Lower SD |
| 1 | NA | NA | 0.03 | 0.12 | 0.03 | 35.41 | 0.72 | 0.73 |
| 9s | Ethylated Starch | 2.02 | 13.00 | 0.94 | 0.93 | 40.81 | 0.76 | 0.78 |
| 9sm | Ethylated Starch + 10% monovalent salt | 0.23 | 13.80 | 0.28 | 0.27 | 42.36 | 0.96 | 1.01 |
| 9sd | Ethylated Starch + 10% divalent salt | 1.09 | 13.02 | 1.63 | 1.59 | 41.02 | 0.80 | 0.82 |
| 9st | Ethylated Starch + 10% trivalent salt | 1.49 | 12.86 | 0.93 | 0.91 | 40.37 | 0.83 | 0.85 |
| 9ss | Ethylated Starch + 5% acrylic copolymer (sizing agent) | 1.2 | 15.35 | 0.46 | 0.44 | 42.13 | 1.06 | 1.11 |

TABLE 5

Functional papers from Example 9 with roughness and electrical properties

| Sample ID | Pre-calendering | Post calendering | Sheffield Roughness (SU) Avg. | SD | Electrical resistance (Ω/cm) Avg | SD |
|---|---|---|---|---|---|---|
| 9s | No | No | 8.32 | 0.62 | 30.34 | 20.47 |
| 9sm | No | No | 8.18 | 0.49 | 4.96 | 0.89 |
| 9sd | No | No | 7.46 | 0.47 | 8.53 | 2.28 |
| 9st | No | No | 7.04 | 0.46 | 6.72 | 1.45 |
| 9ss | No | No | 8.38 | 0.48 | 17.57 | 16.69 |
| 9s | Yes | No | 2.37 | 0.06 | 8.91 | 4.45 |
| 9sm | Yes | No | 2.80 | 0.26 | 2.84 | 0.42 |
| 9sd | Yes | No | 2.80 | 0.40 | 4.42 | 1.58 |
| 9st | Yes | No | 3.20 | 0.26 | 2.92 | 0.89 |
| 9ss | Yes | No | 2.03 | 0.16 | 2.59 | 0.42 |
| 9s | No | Yes | 2.23 | 0.29 | 9.95 | 3.04 |
| 9sm | No | Yes | 2.23 | 0.06 | 4.75 | 1.78 |
| 9sd | No | Yes | 1.90 | 0.36 | 5.33 | 3.77 |
| 9st | No | Yes | 1.87 | 0.15 | 5.93 | 2.82 |
| 9ss | No | Yes | 1.40 | 0.10 | 11.19 | 3.08 |

TABLE 6

Coat weights for papers in Example 2 and Example 10 and respective surface energies.

| Sample ID | Surface treatment | Coat weight (g/m$^2$) | Polar Surface Energy Component (ergs/cm$^2$) Avg. | Upper SD | Lower SD | Dispersive Surface Energy Component (ergs/cm$^2$) Avg. | Upper SD | Lower SD |
|---|---|---|---|---|---|---|---|---|
| 2 | NA | NA | 0.03 | 0.07 | 0.03 | 35.26 | 0.59 | 0.59 |
| 10s | Ethylated Starch | 1.7 | 9.37 | 0.24 | 0.14 | 37.92 | 3.07 | 3.30 |
| 10sm | Ethylated Starch + 10% monovalent salt | 5.27 | 8.26 | 1.20 | 1.09 | 40.02 | 2.40 | 2.59 |
| 10sd | Ethylated Starch + 10% divalent salt | 3.49 | 12.91 | 1.03 | 1.01 | 40.16 | 1.15 | 1.20 |
| 10st | Ethylated Starch + 10% trivalent salt | 2.94 | 10.05 | 1.89 | 1.78 | 41.61 | 0.31 | 0.31 |
| 10ss | Ethylated Starch + 5% acrylic copolymer (sizing agent) | 6.23 | 16.88 | 2.43 | 2.44 | 41.28 | 1.69 | 1.80 |

TABLE 7

Functional papers from example 10 with roughness and electrical properties

| Sample ID | Pre-calendering | Post calendering | Sheffield Roughness (SU) Avg. | SD | Electrical resistance ($\Omega$/cm) Avg | SD |
|---|---|---|---|---|---|---|
| 10s | No | No | 6.92 | 0.52 | 15.54 | 6.73 |
| 10sm | No | No | 7.68 | 2.68 | 1.89 | 0.32 |
| 10sd | No | No | 7.74 | 1.69 | 3.22 | 0.40 |
| 10st | No | No | 7.90 | 1.51 | 1.95 | 0.46 |
| 10ss | No | No | 5.80 | 0.76 | 81.59 | 58.39 |
| 10s | Yes | No | 2.03 | 0.47 | 3.31 | 0.95 |
| 10sm | Yes | No | 1.70 | 0.35 | 1.63 | 0.16 |
| 10sd | Yes | No | 1.63 | 0.25 | 3.98 | 0.47 |
| 10st | Yes | No | 1.90 | 0.61 | 2.44 | 0.26 |
| 10ss | Yes | No | 1.10 | 0.00 | 2.29 | 0.32 |
| 10s | No | Yes | 1.93 | 0.15 | 6.41 | 0.65 |
| 10sm | No | Yes | 1.63 | 0.35 | 3.95 | 1.68 |
| 10sd | No | Yes | 1.43 | 0.12 | 2.15 | 0.42 |
| 10st | No | Yes | 1.57 | 0.32 | 2.08 | 0.84 |
| 10ss | No | Yes | 0.23 | 0.21 | 11.77 | 6.13 |
| 10s | Yes | Yes | NA | NA | 2.05 | 0.18 |
| 10sm | Yes | Yes | NA | NA | 1.91 | 0.13 |

TABLE 8

Additional functional papers from example 10 and electrical properties

| Sample ID | Surface treatment | Pre-calendering | Post calendering | Electrical resistance ($\Omega$/cm) Avg | SD |
|---|---|---|---|---|---|
| 10ms | Ethylated starch + 10% monovalent salt + 5% Acrylic copolymer | No | No | 2.26 | 0.29 |
| 10mm | Ethylated starch + 20% monovalent salt | No | No | 2.47 | 0.31 |
| 10ms | Ethylated starch + 10% monovalent salt + 5% Acrylic copolymer | Yes | No | 1.51 | 0.19 |
| 10mm | Ethylated starch + 20% monovalent salt | Yes | No | 2.38 | 0.45 |
| 10ms | Ethylated starch + 10% monovalent salt + 5% Acrylic copolymer | No | Yes | 2.20 | 0.28 |
| 10mm | Ethylated starch + 20% monovalent salt | No | Yes | 2.00 | 0.26 |
| 10ms | Ethylated starch + 10% monovalent salt + 5% Acrylic copolymer | Yes | Yes | 1.36 | 0.18 |
| 10mm | Ethylated starch + 20% monovalent salt | Yes | Yes | 1.93 | 0.12 |

The surface treatments were prepared by calculating the final weight percentage of the solids in the aqueous medium. 10% solids by weight were targeted for all surface treatment formulations. However, a variation in solids content is possible to achieve changes in the amount of material deposition (e.g. from about 5% to 40%). The solids in the surface treatment comprise one or more ingredients such as ethylated starch, salts, and surface sizing agents.

In the tables above, the amount of additives represent the dry weight percentage of the additives in the total dry mixture of the ethylated starch and additives.

The calculated amount of ethylated starch was cooked in water at concentrations higher than the 10% target solids until the solution becomes translucent. The starch solution was brought to room temperature and precalculated amount of salt and or surface sizing agent was added in the solution. Makeup water was added to reach the final solid contents of 10%. The surface treatment need not be brought to room temperature.

The coatings were applied to the paper substrates using Mayer rod #4 at room temperature. In the production environment, the surface treatment application can be performed using a suitable method at suitable operating temperature.

The printed samples of papers were tested for durability along with the control paper. The printed samples were mechanically scratched using a robotic hand with a pointed tool by applying pressure enough for 0.1 mm displacement (compressive force) of the tip without any resistance. The scratching speed was maintained at 100 mm/s.

Figure 17:
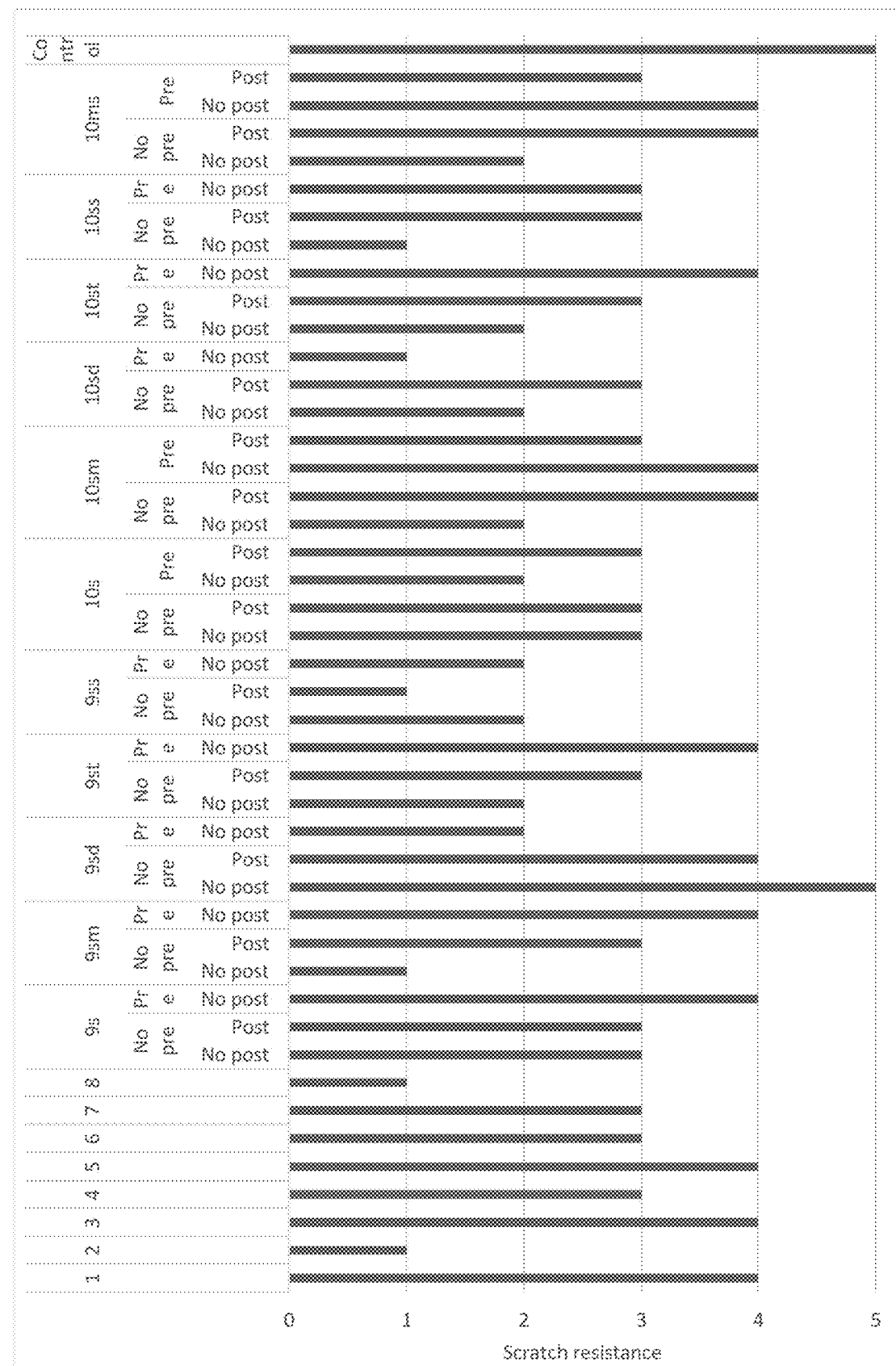
FIG. 17 provides a comparison of the scratch resistance for various coatings, paper, and mechanical treatments. Lower numbers indicate higher scratch resistance.
Figure 18A:
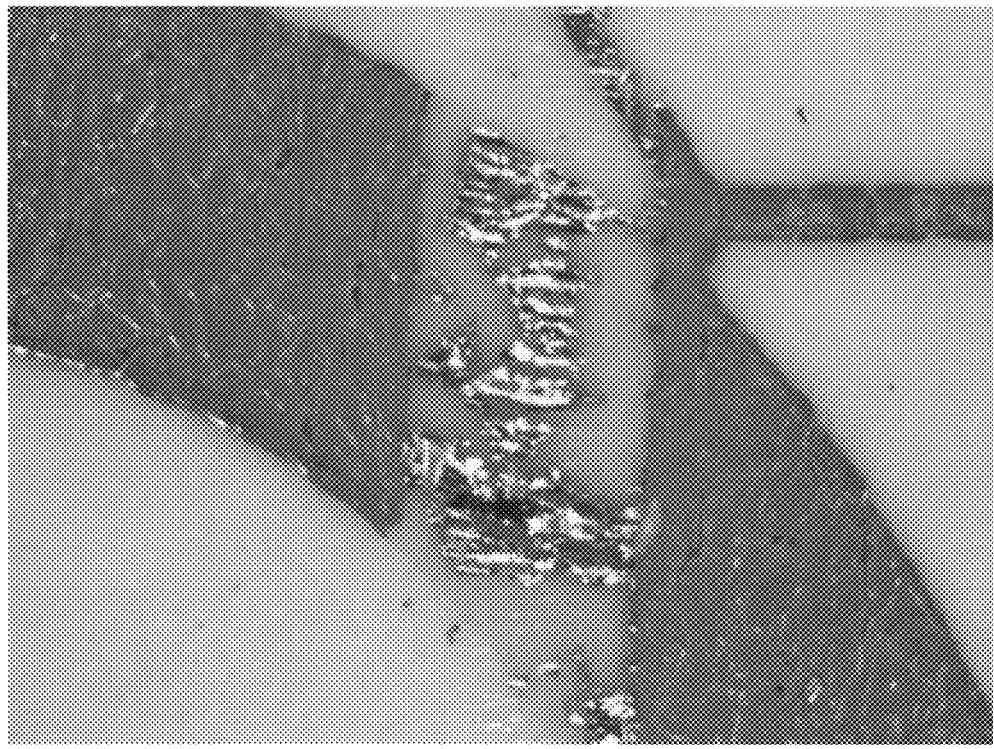
FIGS. 18A-18E are camera images of a scratch test demonstration for (FIG. 18A) Control: Damaged silver ink layer due to complete removal.
Figure 18B:
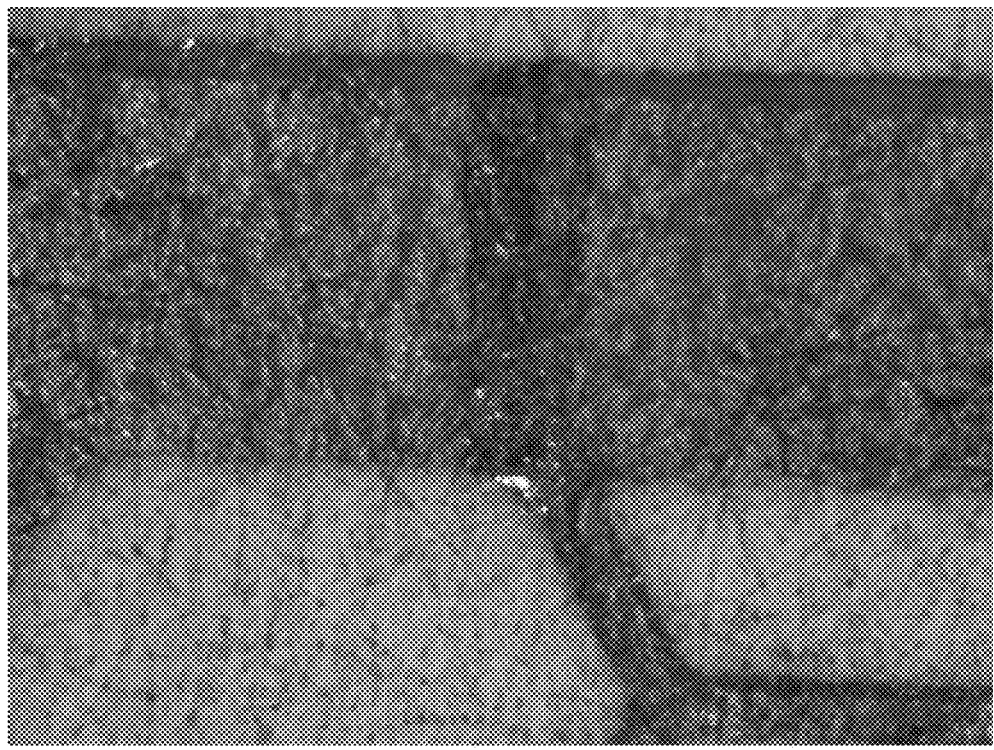
Figure 18C:
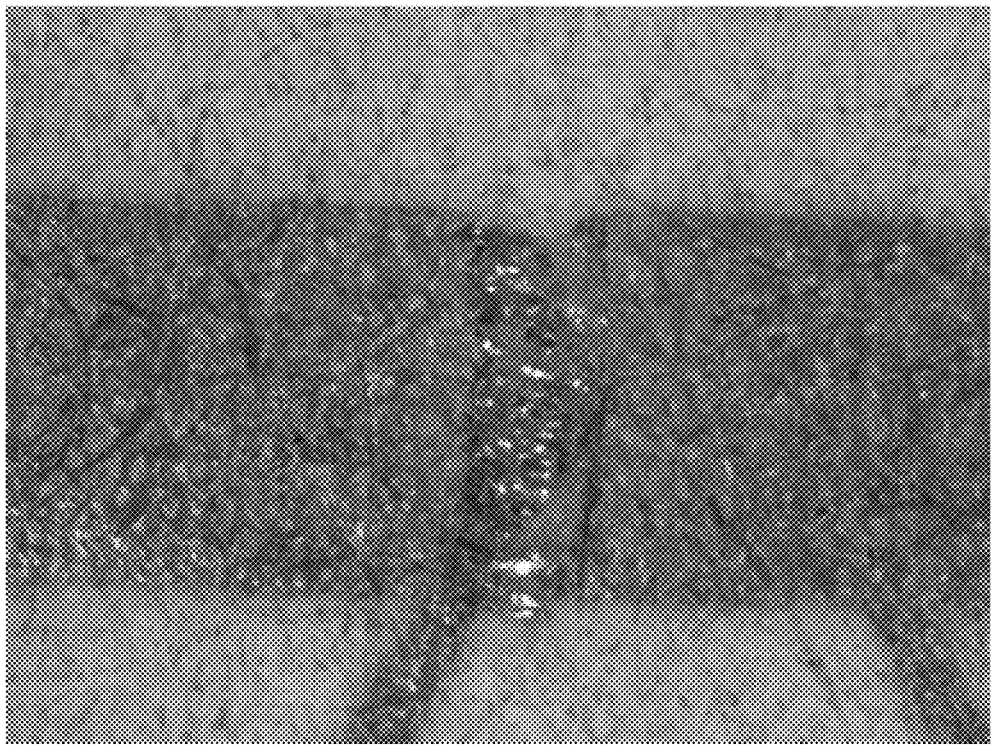
Figure 18D:
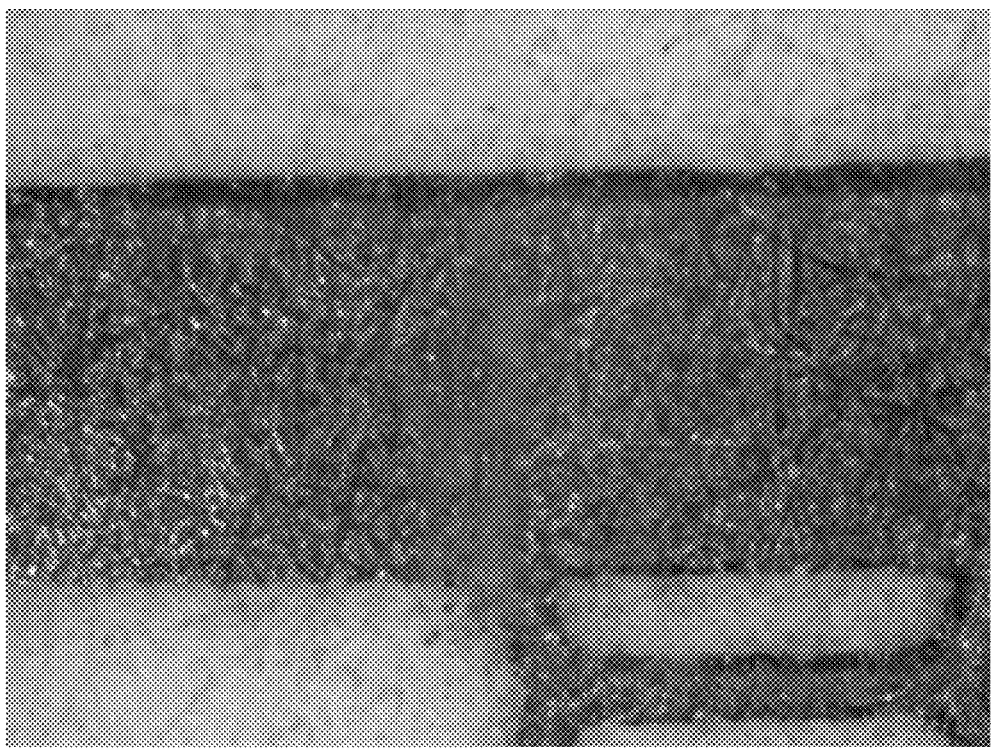
Figure 18E:
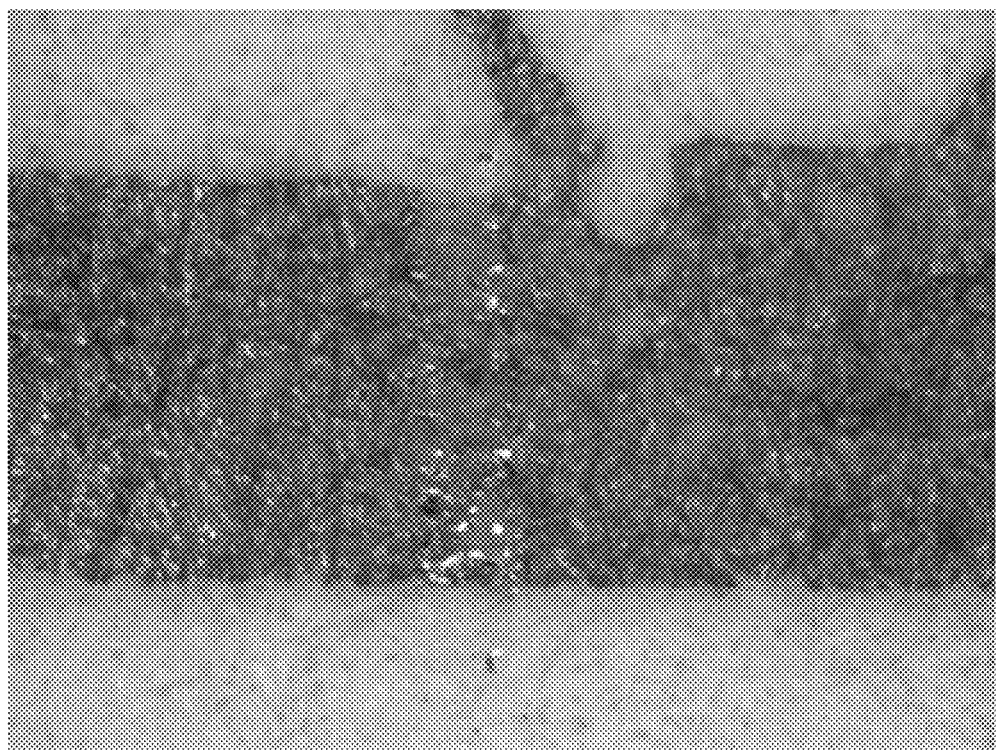

The scratch resistance score of 1 indicates high durability of the print. The increasing score represents loss of durability. Data shown in Table 9 and FIG. 17.

The best scratch resistance was noted for the prints with IDs 2, 8, 9sm, 9ss post-calendered, 10sd pre-calendered, and 10ss. Therefore, the scratch resistance of the printed samples is a combined effect of the substrate, surface treatment material, and the mechanical treatment. Overall, all the example substrates described herein gave better durability except 9sd when compared to control, which is important for downstream processing and actual usage.

FIGS. 18A-18E show the results of a scratch test demonstration for (FIG. 18A) Control: Damaged silver ink layer due to complete removal; (FIG. 18B) Example 8: Surface mark on the ink, but the ink layer remains intact; (FIG. 18C) Example 6: Surface mark with partial removal of the silver ink; (FIG. 18D) Example 7: Surface mark with partial removal of the silver ink; (FIG. 18E) Example 5: Surface mark with partial removal of the silver ink.

TABLE 9

Relative scratch resistance for printed samples in examples 1, 2, 3, 4, 5, 6, 8, 9, 10, and Control

| Sample ID | Pre-- calendering | Post calendering | Relative score for scratch resistance (lower is better with 1 being highly durable) | Comments |
|---|---|---|---|---|
| 1 | No | No | 4 | Example 1 |
| 2 | No | No | 1 | Example 2 |
| 3 | Yes | No | 4 | Example 3 |
| 4 | Yes | No | 3 | Example 4 |
| 5 | No | Yes | 4 | Example 5 |
| 6 | No | Yes | 3 | Example 6 |
| 7 | Yes | Yes | 3 | Example 7 |
| 8 | Yes | Yes | 1 | Example 8 |
| 9s | No | No | 3 | Example 9 |
| 9sm | No | No | 1 | Example 9 |
| 9sd | No | No | 5 | Example 9 |
| 9st | No | No | 2 | Example 9 |
| 9ss | No | No | 2 | Example 9 |
| 9s | Yes | No | 4 | Example 9 |
| 9sm | Yes | No | 4 | Example 9 |
| 9sd | Yes | No | 2 | Example 9 |
| 9st | Yes | No | 4 | Example 9 |
| 9ss | Yes | No | 2 | Example 9 |
| 9s | No | Yes | 3 | Example 9 |
| 9sm | No | Yes | 3 | Example 9 |
| 9sd | No | Yes | 4 | Example 9 |
| 9st | No | Yes | 3 | Example 9 |
| 9ss | No | Yes | 1 | Example 9 |
| 10s | No | No | 3 | Example 10 |
| 10sm | No | No | 2 | Example 10 |
| 10sd | No | No | 2 | Example 10 |
| 10st | No | No | 2 | Example 10 |
| 10ss | No | No | 1 | Example 10 |
| 10s | Yes | No | 2 | Example 10 |
| 10sm | Yes | No | 4 | Example 10 |
| 10sd | Yes | No | 1 | Example 10 |
| 10st | Yes | No | 4 | Example 10 |
| 10ss | Yes | No | 3 | Example 10 |
| 10s | No | Yes | 3 | Example 10 |
| 10sm | No | Yes | 4 | Example 10 |
| 10sd | No | Yes | 3 | Example 10 |
| 10st | No | Yes | 3 | Example 10 |
| 10ss | No | Yes | 3 | Example 10 |
| 10s | Yes | Yes | 3 | Example 10 |
| 10sm | Yes | Yes | 3 | Example 10 |
| 10ms | No | No | 2 | Example 10 |
| 10ms | Yes | No | 4 | Example 10 |
| 10ms | No | Yes | 4 | Example 10 |
| 10ms | Yes | Yes | 3 | Example 10 |
| Control | No | No | 5 | Heavy coated commercial control paper |

Figure 19:
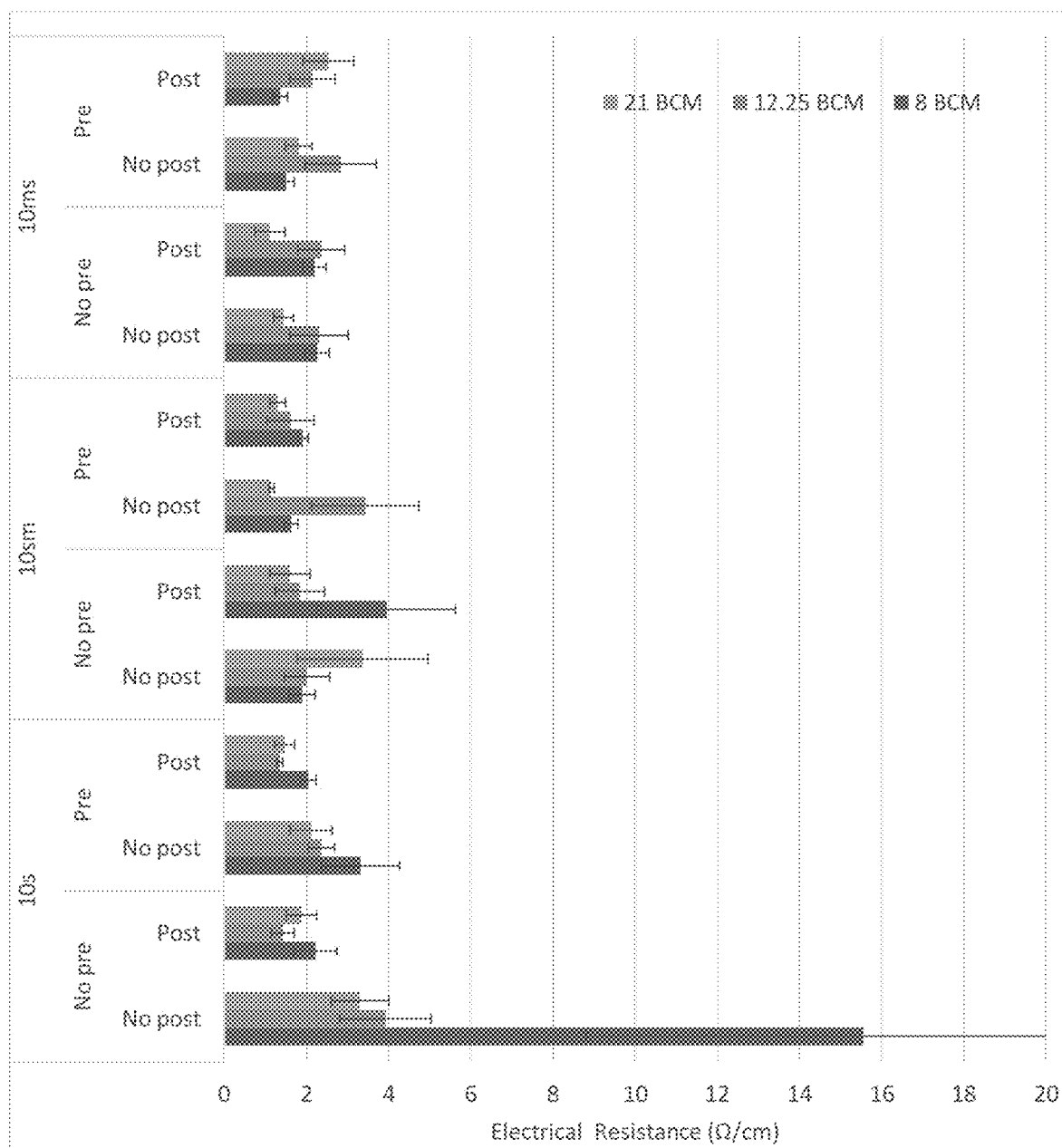
FIG. 19 shows a graph for comparison electrical resistances of the anilox volumes with different surface treatments for Example 2 and Examples 10.

In FIG. 19 and Table 10, it is seen that uncalendered and pre-calendered 10s shows reduced electrical resistance with increased ink volume. Post-calendering does not show a similar trend. The post-calendered 10sm, pre- and post-calendered 10sm show similar trends of reduced electrical resistance with increased ink volume. The lack of trend or reversal of trend for the rest of samples with calendering treatments can be the effect of uneven ink distribution due to the interaction of salt and sizing agent with ink. Thus, the ink volume, surface treatment, and calendering treatment are tunable parts of the system and ink can be saved with the correct combination of the surface treatment and calendering.

TABLE 10

Comparison of different anilox volumes on the electrical resistance of the selective IDs of Examples 10.

| | | | Electrical Resistance (Ω/cm) | | | | | | |
|---|---|---|---|---|---|---|---|---|---|
| | | | 8 bcm anilox | | 12.25 bcm anilox | | 21 bcm anilox | | |
| Sample ID | Pre-calendering | Post-calendering | Avg | SD | Avg | SD | Avg | SD | Comment |
| 10s | No | No | 15.54 | 6.73 | 3.92 | 1.12 | 3.30 | 0.70 | Example 10 |
| 10sm | No | No | 1.89 | 0.32 | 2.01 | 0.55 | 3.37 | 1.59 | Example 10 |
| 10ms | No | No | 2.26 | 0.29 | 2.30 | 0.71 | 1.44 | 0.24 | Example 10 |
| 10s | Yes | No | 3.31 | 0.95 | 2.36 | 0.32 | 2.11 | 0.51 | Example 10 |
| 10sm | Yes | No | 1.63 | 0.16 | 3.43 | 1.31 | 1.15 | 0.06 | Example 10 |
| 10ms | Yes | No | 1.51 | 0.19 | 2.83 | 0.86 | 1.81 | 0.32 | Example 10 |
| 10s | No | Yes | 2.22 | 0.52 | 1.42 | 0.28 | 1.88 | 0.37 | Example 10 |
| 10sm | No | Yes | 3.95 | 1.68 | 1.84 | 0.60 | 1.60 | 0.49 | Example 10 |
| 10ms | No | Yes | 2.20 | 0.28 | 2.36 | 0.57 | 1.11 | 0.37 | Example 10 |
| 10s | Yes | Yes | 2.05 | 0.18 | 1.35 | 0.07 | 1.47 | 0.24 | Example 10 |
| 10sm | Yes | Yes | 1.91 | 0.13 | 1.61 | 0.57 | 1.30 | 0.19 | Example 10 |
| 10ms | Yes | Yes | 1.36 | 0.18 | 2.14 | 0.55 | 2.53 | 0.62 | Example 10 |

CONCLUSIONS

As can be seen from the improved scratch resistance in Examples 2 and 8, the base sheet formulation helped improving ink anchoring and print durability. However, the change in paper formulation for Example 1 required further surface treatments developed as in example 9, mainly sub examples 9sm, and 9ss, with the calendering. Multiple pre-calendering passes were used in Example 8. By using the surface treatments in Example 10 (e.g. examples 10ss, and 10sd) assisted via pre-calendering, the need for multiple pre-calendering passes was eliminated.

When coupled with the electrical resistance testing, the least electrical resistance is favorable for better electrical conductivity. Example 8 showed the least electrical resistance; however the paper needs multiple passes through the calendering nips. The performance can be improved (as shown in such as Example 10sd) by post-calendering and the inclusion of divalent salt to reduce the electrical resistance. Comparable results were obtained for the examples 9ss and 9sm with pre-calendering. In both cases for sub versions of example 9 and example 10, the presence of salts improved the electrical conductivity and eliminated the need for simultaneous pre- and post-calendering.

Ignoring the scratch resistance factor, the presence of the monovalent salts shows better electrical conductivity with only pre- or post-calendering as seen in examples 9sm, 10sm as compared with other surface treatment formulations.

The effect of addition of the acrylic copolymer sizing agent (shown in Table 8) in the surface treatment reduced the electrical resistance as compared to simply increasing the salt levels. The pre-calendering alone enhances the electrical conductivity for the example 10 ms over the post-calendering alone. A combination of both pre- and post-calendering showed better electrical conductivity.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, "about 0" can refer to 0, 0.001, 0.01, or 0.1. In an embodiment, the term "about" can include traditional rounding according to significant figures of the numerical value. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

What is claimed is:

1. A method of making a functional paper comprising:
    forming a paper from a slurry, the slurry comprising about 10 wt % to 90 wt % cellulosic fibers and about 1% to 25% sizing solution per total weight of the fibers;
    calendering the paper at a temperature greater than 50° C. and a pressure between 100 psi and 1500 psi;
    printing on the paper with a conductive ink wherein the calendering can be performed before printing, after printing, or both;
    applying an internal sizing agent at a wet end of a paper machine; and
    applying a surface sizing solution at a dry end of the paper machine using a size press,
    wherein the surface sizing solution is selected from an aqueous solution comprising 10% solids by weight, wherein the solids comprise about 90 wt % ethylated starch and 10 wt % NaCl or wherein the solids comprise about 85 wt % ethylated starch, 10 wt % NaCl and 5 wt % acrylic copolymer.

2. The method of claim 1, further comprising applying the surface sizing solution to the paper using a rod coater to form sized and treated sheets.

3. The method of claim 2, wherein the surface treatment comprises a film-forming material in an aqueous medium, wherein the film-forming material is selected from ethylated starch, alginate, carboxymethyl cellulose (CMC), SBR latex (SBR), polyvinyl alcohol, and combinations thereof.

4. The method of claim 2, wherein the surface treatment further comprises one or more additives, wherein the additives are selected from a salt, a surface sizing agent, or a combination thereof.

5. The method of claim 4, wherein the surface sizing agent comprises acrylic copolymer or a copolymer of styrene and maleic anhydride.

6. The method of claim 4, wherein the salt is selected from a monovalent salt, a divalent salt, a multivalent salt, and a combination thereof, and wherein the surface treatment comprises about 10 wt % salt.

\* \* \* \* \*